United States Patent
Cherala et al.

(10) Patent No.: US 7,298,456 B2
(45) Date of Patent: *Nov. 20, 2007

(54) SYSTEM FOR VARYING DIMENSIONS OF A SUBSTRATE DURING NANOSCALE MANUFACTURING

(75) Inventors: Anshuman Cherala, Austin, TX (US); Byung-Jin Choi, Austin, TX (US); Pawan K. Nimmakayala, Austin, TX (US); Mario J. Meissl, Austin, TX (US); Sidlgata V. Sreenivasan, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/142,808

(22) Filed: Jun. 1, 2005

(65) Prior Publication Data

US 2006/0001194 A1  Jan. 5, 2006

Related U.S. Application Data

(60) Division of application No. 11/142,834, filed on Jun. 1, 2005, and a division of application No. 11/142,839, filed on Jun. 1, 2005, now Pat. No. 7,170,589, which is a continuation-in-part of application No. 10/999,898, filed on Nov. 30, 2004, now abandoned.

(60) Provisional application No. 60/576,879, filed on Jun. 3, 2004.

(51) Int. Cl.
*G03B 27/58* (2006.01)
*G03B 27/42* (2006.01)

(52) U.S. Cl. .......................................... 355/72; 355/53

(58) Field of Classification Search .................. 355/72, 355/53, 75; 356/399, 400, 401; 451/9, 41, 451/288, 398
See application file for complete search history.

(56) References Cited

U.S. PATENT DOCUMENTS 3,783,520 A    1/1974  King (Continued)

OTHER PUBLICATIONS

Martin et al., Predication of Fabrication Distortions in Step and Flash Imprint Lithography Templates, Journal of Vacuum Science Technology B 20(6), pp. 2891-2895 Nov. 1, 2002.

(Continued)

*Primary Examiner*—Peter B. Kim
(74) *Attorney, Agent, or Firm*—Michael D. Carter; Fish & Richardson P.C.

(57) ABSTRACT

The present invention is directed toward a system to vary dimensions of a substrate, such as a template having a patterned mold. To that end, the system includes a substrate chuck adapted to position the substrate in a region; a pliant member; and an actuator sub-assembly elastically coupled to the substrate chuck through the pliant member. The actuator assembly includes a plurality of lever sub-assemblies, one of which includes a body lying in the region and spaced-apart from an opposing body associated with one of the remaining lever sub-assemblies of the plurality of lever sub-assemblies. One of the plurality of lever assemblies is adapted to vary a distance between the body and the opposing body. In this manner, compressive forces may be applied to the template to remove unwanted magnification or other distortions in the pattern on the mold. The pliant member is configured to attenuate a magnitude of resulting Forces sensed by the substrate chuck generated in response to the compressive forces.

18 Claims, 15 Drawing Sheets

U.S. PATENT DOCUMENTS

| | | |
|---|---|---|
| 4,256,829 A | 3/1981 | Daniel |
| 4,326,805 A | 4/1982 | Feldman et al. |
| 4,492,554 A | 1/1985 | Carter |
| 4,600,309 A | 7/1986 | Fay |
| 4,724,222 A | 2/1988 | Feldman |
| 4,848,911 A | 7/1989 | Uchida et al. |
| 4,887,283 A | 12/1989 | Hosno |
| 4,929,083 A | 5/1990 | Brunner |
| 4,964,145 A | 10/1990 | Maldonado |
| 5,072,126 A | 12/1991 | Progler |
| 5,074,667 A | 12/1991 | Miyatake |
| 5,148,036 A | 9/1992 | Matsugu et al. |
| 5,148,037 A | 9/1992 | Suda et al. |
| 5,155,749 A | 10/1992 | DiMilia et al. |
| 5,184,176 A | 2/1993 | Unno et al. |
| 5,204,739 A | 4/1993 | Domenicali |
| 5,355,219 A | 10/1994 | Araki et al. |
| 5,414,514 A | 5/1995 | Smith et al. |
| 5,452,090 A | 9/1995 | Progler et al. |
| 5,504,793 A | 4/1996 | Chen |
| 5,563,684 A | 10/1996 | Stagaman |
| 5,633,505 A | 5/1997 | Chung et al. |
| 5,737,064 A | 4/1998 | Inoue et al. |
| 5,802,914 A | 9/1998 | Fassler et al. |
| 5,808,742 A | 9/1998 | Everett et al. |
| 5,820,894 A | 10/1998 | Kreutzer |
| 5,854,819 A | 12/1998 | Hara et al. |
| 5,877,036 A | 3/1999 | Kawai |
| 5,877,861 A | 3/1999 | Ausschnitt et al. |
| 5,999,245 A | 12/1999 | Suzuki |
| 6,019,166 A | 2/2000 | Viswanath et al. |
| 6,049,373 A | 4/2000 | Miyatake |
| 6,088,103 A | 7/2000 | Everett et al. |
| 6,137,562 A | 10/2000 | Masuyuki et al. |
| 6,150,231 A | 11/2000 | Muller et al. |
| 6,285,439 B1 | 9/2001 | Miyatake |
| 6,295,120 B1 | 9/2001 | Miyatake |
| 6,383,888 B1 | 5/2002 | Stirton |
| 6,388,755 B1 | 5/2002 | Zhao |
| 6,420,892 B1 | 7/2002 | Krivy et al. |
| 6,489,068 B1 | 12/2002 | Kye |
| 6,522,411 B1 | 2/2003 | Moon et al. |
| 6,630,410 B2 | 10/2003 | Trapp et al. |
| 6,636,311 B1 | 10/2003 | Ina et al. |
| 6,665,119 B1 | 12/2003 | Kurtz et al. |
| 6,770,852 B1 | 8/2004 | Stegner |
| 6,791,669 B2 | 9/2004 | Poon |
| 6,796,784 B1 | 9/2004 | Andre |
| 6,847,433 B2 | 1/2005 | White et al. |
| 6,916,585 B2 | 7/2005 | Sreenivasan et al. |
| 6,919,152 B2 | 7/2005 | Sreenivasan et al. |
| 6,929,762 B2 | 8/2005 | Rubin |
| 6,980,282 B2 | 12/2005 | Choi et al. |
| 6,982,783 B2 | 1/2006 | Choi et al. |
| 2002/0018190 A1 | 2/2002 | Nogawa et al. |
| 2002/0150398 A1 | 10/2002 | Choi et al. |
| 2003/0081193 A1 | 5/2003 | White et al. |
| 2003/0092261 A1 | 5/2003 | Kondo et al. |
| 2003/0179354 A1 | 9/2003 | Araki et al. |
| 2004/0033515 A1 | 2/2004 | Cao et al. |
| 2004/0146792 A1 | 7/2004 | Nimmakayala et al. |
| 2005/0006343 A1 | 1/2005 | Choi et al. |
| 2006/0001857 A1 | 1/2006 | Cherala et al. |

OTHER PUBLICATIONS

White et al., Novel Alignment System for Imprint Lithography, J. Vac. Sci. Technol. B 18(6), pp. 3552-3556 Nov. 1, 2000.

Uchida et al., A Mask-to-Wafer Alignment and Gap Setting Method for X-ray Lithography Using Gratings, J. Vac. Sci. Technol. B 9 (6), pp. 3202-3206 Nov. 1, 1991.

Schneider et al., The Wave-Printer: Towards Large-Area, Multilayer Microcontact-Printing, Proc. Of 4th euspen International Conference, Glasgos, Scotland (UK) May 1, 2004.

U.S. Appl. No. 10/999,898, naming Inventors Cherala et al., entitled System for Magnification and Distortion Correction during Nano-Scale Manufacturing, filed Nov. 30, 2004.

Wronosky et al., Wafer and Reticle Positioning System for the Extreme Ultraviolet Lithography Engineering Test Stand, Emerging Lithography Technologies, Proceedings of SPIE vol. 3997, pp. 829-839 Jul. 1, 2000.

Park et al., Aligning Liquid Crystals Using Replicated Nanopatterns, PSI Scientific Report 2002, vol. VII, p. 85 Mar. 1, 2003.

U.S. Appl. No. 11/142,834, naming Inventors Cherala et al., entitled Method of Varying Dimensions of a Substrate during Nano-Scale Manufacturing, filed Jun. 1, 2005.

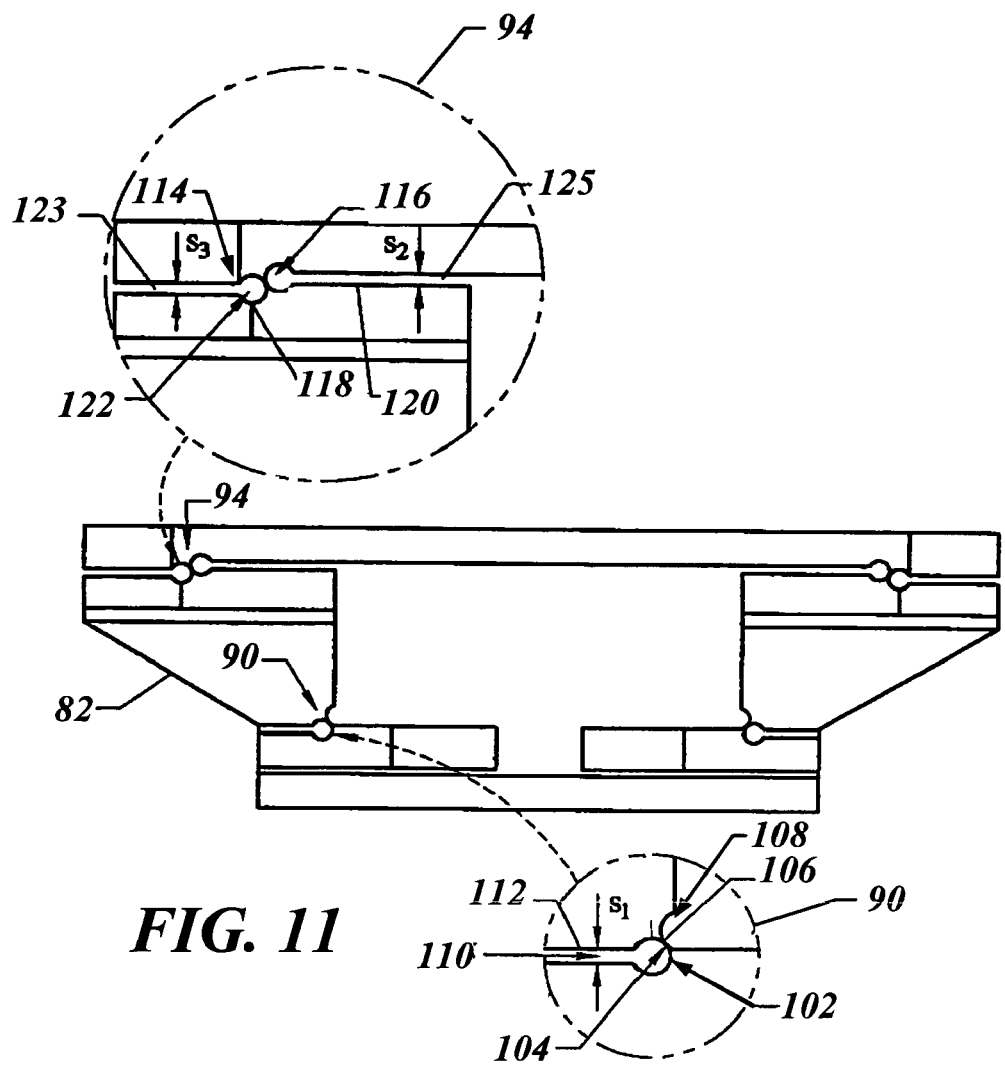
FIG. 11
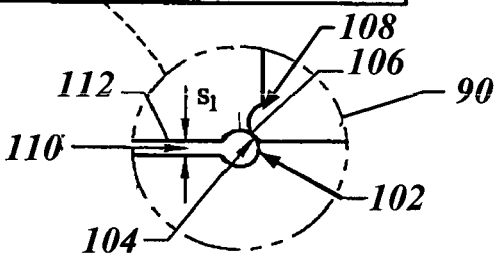
FIG. 12   FIG. 13

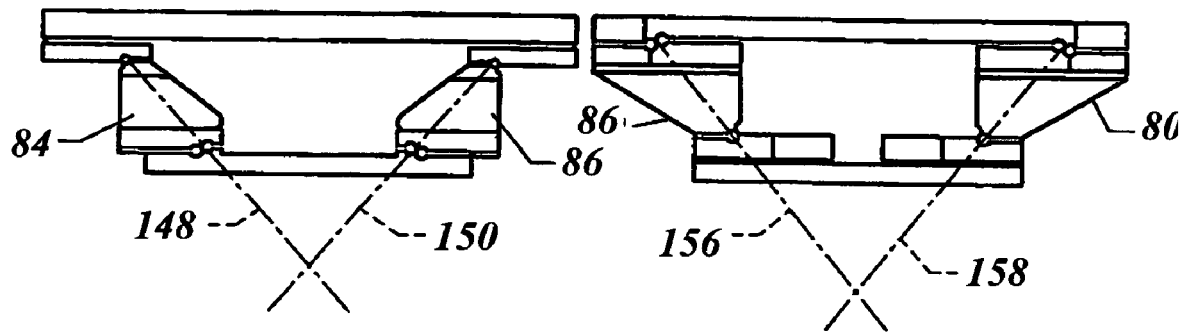
FIG. 14  FIG. 15
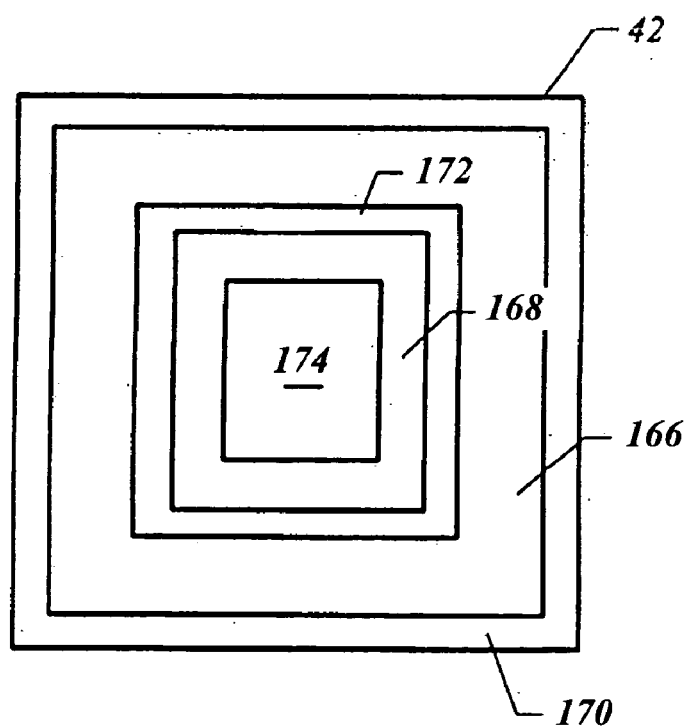
FIG. 16

SYSTEM FOR VARYING DIMENSIONS OF A SUBSTRATE DURING NANOSCALE MANUFACTURING

CROSS-REFERENCE TO RELATED APPLICATIONS

The present application claims priority to U.S. Provisional Patent Application No. 60/576,879 filed on Jun. 3, 2004, entitled "System and Method for Magnification and Distortion Correction during Nano-Scale Manufacturing," naming inventors Anshuman Cherala, Byung-Jin Choi, Pawan K. Nimmakayala, Mario J. Meissl and Sidlgata V. Sreenivasan and is a divisional application of U.S. Pat. No. 11/142,834, filed Jun. 1, 2005, entitled "Method of Varying Dimensions of a Substrate during Nano-Scale Manufacturing," naming inventors Anshuman Cherala, Byung-Jin Choi, Pawan K. Nimmakayala, Mario J. Meissl and Sidlgata V. Sreenivasan; and a divisional application of U.S. Pat. No. 11/142,839, filed Jun. 1, 2005 now U.S. Pat. No. 7,170,589, entitled "Apparatus to Vary Dimensions of a Substrate during Nano-Scale Manufacturing," naming inventors Anshuman Cherala, Byung-Jin Choi, Pawan K. Nimmakayala, Mario J. Meissl and Sidlgata V. Sreenivasan which is also a continuation-in-part of U.S. patent application Ser. No. 10/999,898, filed Nov. 30, 2004, now abandoned entitled "System for Magnification and Distortion Correction during Nano-scale Manufacturing," naming inventors Anshuman Cherala, Byung-Jin Choi, Pawan K. Nimmakayala, Mario J. Meissl and Sidlgata V. Sreenivasan; which application claims priority to U.S. Provisional Patent Application No. 60/576,879 filed on Jun. 3, 2004, entitled "System and Method for Magnification and Distortion Correction during Nano-Scale Manufacturing," naming inventors Anshuman Cherala, Byung-Jin Choi, Pawan K. Nimmakayala, Mario J. Meissl and Sidlgata V. Sreenivasan.

STATEMENT REGARDING FEDERALLY SPONSORED RESEARCH OR DEVELOPMENT

The government of these United States has a paid-up license in this invention and the right in limited circumstance to require the patent owner to license others on reasonable terms as provided by the terms of N66001-01-1-8964 and N66001-02-C-8011 awarded by the Defense Advanced Research Projects Agency (DARPA).

BACKGROUND OF THE INVENTION

The field of invention relates generally to imprint lithography. More particularly, the present invention is directed to reducing pattern distortions during imprint lithography processes.

Micro-fabrication involves the fabrication of very small structures, e.g., having features on the order of micro-meters or smaller. One area in which micro-fabrication has had a sizeable impact is in the processing of integrated circuits. As the semiconductor processing industry continues to strive for larger production yields while increasing the circuits per unit area formed on a substrate, micro-fabrication becomes increasingly important. Micro-fabrication provides greater process control while allowing increased reduction of the minimum feature dimension of the structures formed. Other areas of development in which micro-fabrication has been employed include biotechnology, optical technology, mechanical systems and the like.

An exemplary micro-fabrication technique is commonly referred to as imprint lithography and is described in detail in numerous publications, such as United States published patent applications 2004/0065976, entitled METHOD AND A MOLD TO ARRANGE FEATURES ON A SUBSTRATE TO REPLICATE FEATURES HAVING MINIMAL DIMENSIONAL VARIABILITY; 2004/0065252, entitled METHOD OF FORMING A LAYER ON A SUBSTRATE TO FACILITATE FABRICATION OF METROLOGY STANDARDS; and 2004/0046271, entitled METHOD AND A MOLD TO ARRANGE FEATURES ON A SUBSTRATE TO REPLICATE FEATURES HAVING MINIMAL DIMENSIONAL VARIABILITY, all of which are assigned to the assignee of the present invention. The fundamental imprint lithography technique as shown in each of the aforementioned published patent applications includes formation of a relief pattern in a polymerizable layer and transferring a pattern corresponding to the relief pattern into an underlying substrate. To that end, a template is employed spaced-apart from the substrate with a formable liquid present between the template and the substrate. The liquid is solidified to form a solidified layer that has a pattern recorded therein that is conforming to a shape of the surface of the template in contact with the liquid. The substrate and the solidified layer are then subjected to processes to transfer, into the substrate, a relief image that corresponds to the pattern in the solidified layer.

One manner in which to locate the polymerizable liquid between the template and the substrate is by depositing a plurality of droplets of the liquid on the substrate. Thereafter, the polymerizable liquid is concurrently contacted by both the template and the substrate to spread the polymerizable liquid over the surface of the substrate. It is desirable to properly align the template with the substrate so that the proper orientation between the substrate and template may be obtained. To that end, both the template and substrate include alignment marks. A concern with these processes involves distortions in the pattern resulting from, inter alia, extenuative variations in the imprinting layer and/or the substrate, as well as misalignment of the template with respect to the substrate.

It is desired, therefore, to provide a system to reduce distortions in patterns, due to magnification and alignment variations, formed using imprint lithographic techniques.

SUMMARY OF THE INVENTION

The present invention is directed toward a system to vary dimensions of a substrate, such as a template having a patterned mold. To that end, the system includes a substrate chuck adapted to position the substrate in a region; a pliant member; and an actuator sub-assembly elastically coupled to the substrate chuck through the pliant member. The actuator assembly includes a plurality of lever sub-assemblies, one of which includes a body lying in the region and spaced-apart from an opposing body associated with one of the remaining lever sub-assemblies of the plurality of lever sub-assemblies. One of the plurality of lever assemblies is adapted to vary a distance between the body and the opposing body. In this manner, compressive forces may be applied to the template to remove unwanted magnification or other distortions in the pattern on the mold. The pliant member is configured to attenuate a magnitude of resulting forces sensed by the substrate chuck generated in response to the compressive forces. These and other embodiments are discussed more fully below.

BRIEF DESCRIPTION OF THE DRAWINGS

FIG. 11 is a side view of the passive compliant, device shown in FIG. 10, showing detail of flexure joints included therewith;

FIG. 12 is a side view of the passive compliant device shown in FIG. 10;

FIG. 13 is a side view of the compliant device, shown in FIG. 12, rotated 90 degrees;

FIG. 14 is a side view of the compliant device, shown in FIG. 10, rotated 180 degrees;

FIG. 15 is a side view of the compliant device, shown in FIG. 10, rotated 270 degrees;

FIG. 16 is a bottom-up plan view of a chuck body shown in FIG. 6;

DETAILED DESCRIPTION OF THE INVENTION

Figure 1:
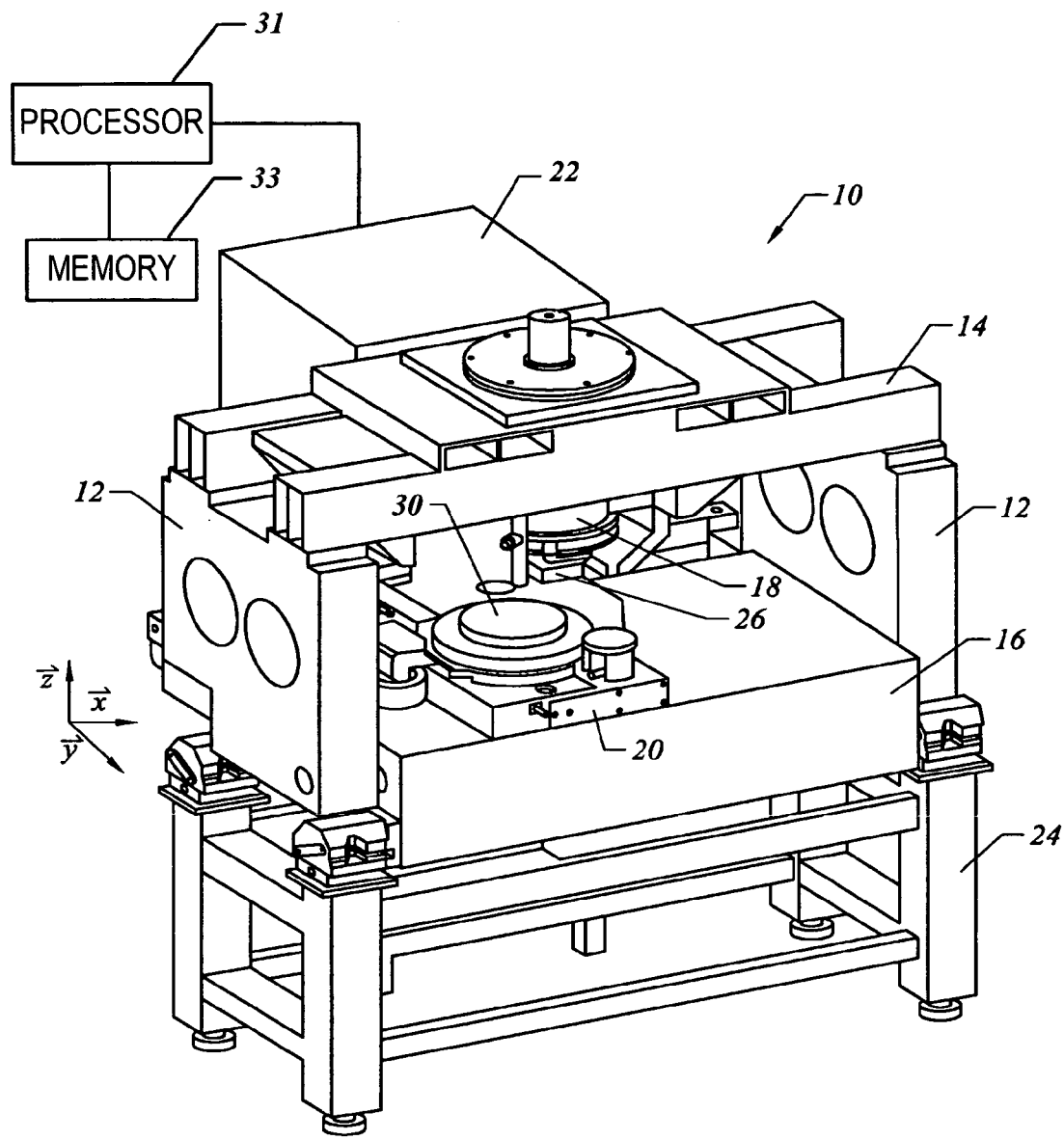
FIG. 1 is a perspective view of a lithographic system in accordance with the present invention.

FIG. 1 depicts a lithographic system 10 in accordance with one embodiment of the present invention that includes a pair of spaced-apart bridge supports 12 having a bridge 14 and a stage support 16 extending therebetween. Bridge 14 and stage support 16 are spaced-apart. Coupled to bridge 14 is an imprint head 18, which extends from bridge 14 toward stage support 16. Disposed upon stage support 16 to face imprint head 18 is a motion stage 20. Motion stage 20 is configured to move with respect to stage support 16 along X and Y axes, but may move along the Z-axis as well. An exemplary motion stage device is disclosed in U.S. patent application Ser. No. 10/194,414, filed Jul. 11, 2002, (issued as U.S. Pat. No. 6,900,881) entitled "Step and Repeat Imprint Lithography Systems," assigned to the assignee of the present invention. A source 22 is coupled to system 10 to impinge actinic energy upon motion stage 20. Operation of system 10 is under control of a processor 31 in data communication with a memory 33 containing computer readable code that defines instructions to regulate the operation of the various components of system 10.

Figure 2:
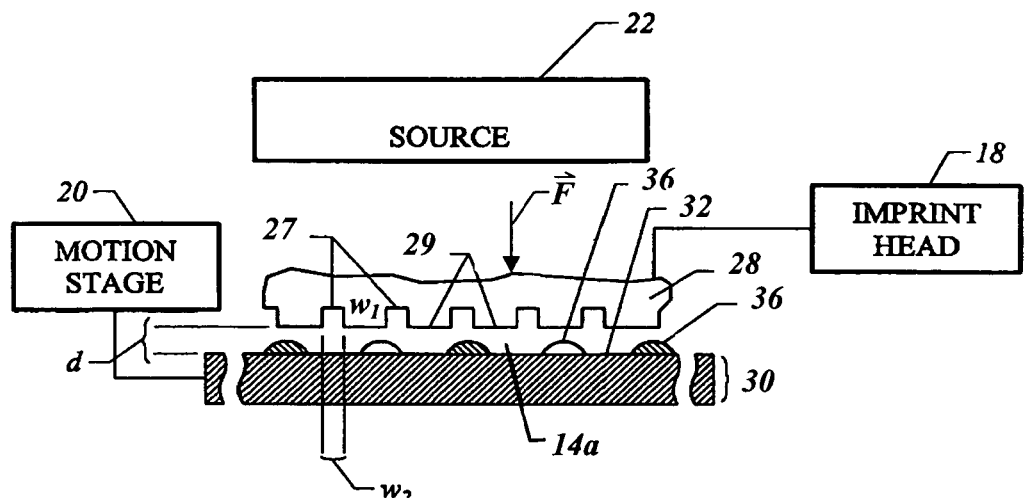
FIG. 2 is a simplified elevation view of a lithographic system shown in FIG. 1.

Referring to both FIGS. 1 and 2, connected to imprint head 18 is a template 26 having a mold 28 thereon. Mold 28 includes a plurality of features defined by a plurality of spaced-apart recessions 27 and protrusions 29. The plurality of features defines an original pattern that forms the basis of a pattern to be transferred into a wafer 30 positioned on motion stage 20. To that end, imprint head 18 is adapted to move along the Z-axis and vary a distance "d" between mold 28 and wafer 30, but may move along the X and Y axes as well. In this manner, the features on mold 28 may be imprinted into a flowable region of wafer 30, discussed more fully below. Source 22 is located so that mold 28 is positioned between source 22 and wafer 30. As a result, mold 28 is fabricated from material that allows it to be substantially transparent to the energy produced by source 22.

Referring to FIG. 2, a flowable region is formed on a portion of surface 32 that presents a substantially planar profile. The flowable region may be formed using any known technique such as a hot embossing process disclosed in U.S. Pat. No. 5,772,905, or a laser assisted direct imprinting (LADI) process of the type described by Chou et al. in "*Ultrafast and Direct Imprint of Nanostructures in Silicon,*" Nature, Col. 417, pp. 835-837, June 2002. In the present embodiment, however, flowable region consists of a plurality of spaced-apart discrete droplets 36 of the imprinting material on wafer 30, discussed more fully below. An exemplary system for depositing droplets 36 is disclosed in U.S. patent application Ser. No. 10/191,749, filed Jul. 9, 2002, issued as U.S. Pat. No. 6,926,929), entitled "System and Method for Dispensing Liquids," and which is assigned to the assignee of the present invention. Droplets 36 include imprinting material that may be selectively polymerized and cross-linked to record a pattern corresponding to the original pattern therein, defining a recorded pattern formed into an imprint layer 34. An exemplary composition for the imprinting material is disclosed in U.S. patent application Ser. No. 10/463,396, filed Jun. 16, 2003 (published as U.S. publication number 2004-0256764-A1) and entitled "Method to Reduce Adhesion Between a Conformable Region and a Pattern of a Mold."

Figure 3:
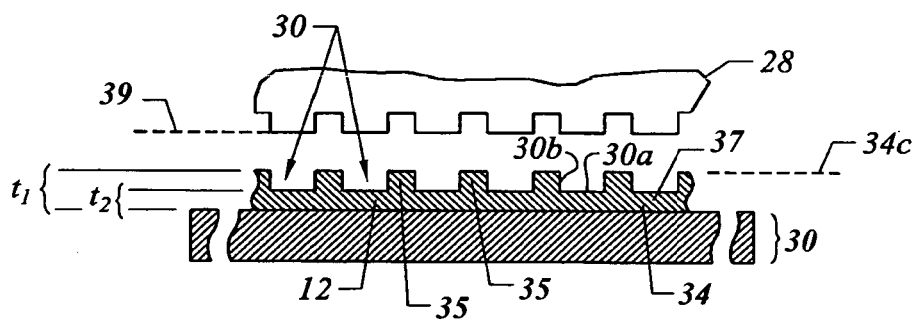
FIG. 3 is a simplified elevation view of a mold spaced-apart from an imprinting layer, shown in FIG. 1, after patterning of the imprinting layer.

Referring to FIGS. 2 and 3, the pattern recorded in imprinting layer 34 is produced, in part, by interaction with mold 28, e.g., mechanical contact, electrical contact and the like. In the present example, the distance "d" is reduced to allow droplets 36 to come into mechanical contact with mold 28, and form a contiguous formation of the imprinting material over surface 32 that may subsequently be solidified to form imprinting layer 34. In one embodiment, distance "d" is reduced to allow sub-portions 35 of imprinting layer 34 to ingress into and fill recessions 27.

To facilitate filling of recessions 27, imprinting material employed possesses the desired properties to completely fill recessions 27 while covering surface 32 with a contiguous formation of the imprinting material. In the present embodiment, sub-portions 37 of imprinting layer 34 in superimposition with protrusions 29 remain after the desired, usually minimum distance "d", has been reached, leaving sub-portions 35 with a thickness $t_1$, and sub-portions 37 with a thickness, $t_2$. Thicknesses "$t_1$" and "$t_2$" may be any thickness desired, dependent upon the application.

Referring to FIGS. 2 and 3, after a desired distance "d" has been reached, source 22 produces actinic energy that polymerizes and cross-links the imprinting material, forming cross-linked polymer material. As a result, the composition of imprinting material transforms from a liquified state to a solidified state. Specifically, the imprinting material is solidified to provide imprinting layer 34 with a side having a shape conforming to a shape of a surface 39 of mold 28, shown more clearly in FIG. 3. After formation of solidified imprinting layer 34 distance "d" is increased so that mold 28 and solidified imprinting layer 34 are spaced-apart.

Figure 4:
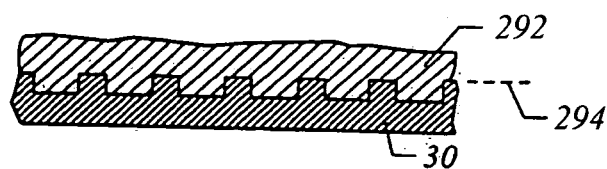
FIG. 4 is a simplified elevation view of an additional imprinting layer positioned atop of the substrate, shown in FIG. 3, after the pattern in the first imprinting layer is transferred therein.

Referring to FIG. 3, additional processing may be employed to complete the patterning of wafer 30. For example, wafer 30 and solidified imprinting layer 34 may be etched to transfer a pattern of solidified imprinting layer 34 into wafer 30, providing a patterned surface 294, shown in FIG. 4. Referring again to FIG. 3, to facilitate etching, the material from which solidified imprinting layer 34 is formed may be varied to define a relative etch rate with respect to wafer 30, as desired. Alternatively, or in addition to, solidified imprinting layer 34 may be provided with an etch differential with respect to photo-resist material (not shown) selectively disposed thereon. The photo-resist material (not shown) may be provided to further pattern solidified imprinting layer 34, using known techniques. Any etch process may be employed, dependent upon the etch rate desired and the underlying constituents that form wafer 30 and solidified imprinting layer 34. Exemplary etch processes may include plasma etching, reactive ion etching, chemical wet etching and the like. It should be understood that wafer 30 is used in a general sense and may include any type of substrate suitable for patterning with the described process. For example, wafer 30 may be a bare semiconductor wafer 34 with or without a native oxide thereon, e.g., a silicon wafer. Alternatively, wafer 30 may have one or more layers disposed thereon, such as a primer layer formed from a material sold under a tradename DUV30J-6 available from Brewer Science, Inc. of Rolla, Mo.

Referring to both FIGS. 1 and 2 an exemplary source 22 may produce ultraviolet energy. Other energy sources may be employed, such as thermal, electromagnetic and the like. The selection of energy employed to initiate the polymerization of the imprinting material is known to one skilled in the art and typically depends on the specific application which is desired. Furthermore, the plurality of features on mold 28 are shown as recessions 27 extending along a direction parallel to protrusions 29 that provide a cross-section of mold 28 with a shape of a battlement. However, recessions 27 and protrusions 29 may correspond to virtually any feature desired, including features to create an integrated circuit and may be as small as a few nanometers. As a result, it may be desired to manufacture components of system 10 from materials that are thermally stable, e.g., have a thermal expansion coefficient of less than about 10 ppm/degree Centigrade at about room temperature (e.g., 25 degrees Centigrade). In some embodiments, the material of construction may have a thermal expansion coefficient of less than about 10 ppm/degree Centigrade, or less than 1 ppm/degree Centigrade. To that end, bridge supports 12, bridge 14, and/or stage support 16 may be fabricated from one or more of the following materials: iron alloys available under the trade name INVAR®, or name SUPER INVAR™, ceramics, including but not limited to ZERODUR® ceramic and silicon carbide. Additionally a table 24 may be constructed to isolate the remaining components of system 10 from vibrations in the surrounding environment. An exemplary table 24 is available from Newport Corporation of Irvine, Calif.

Figure 5:
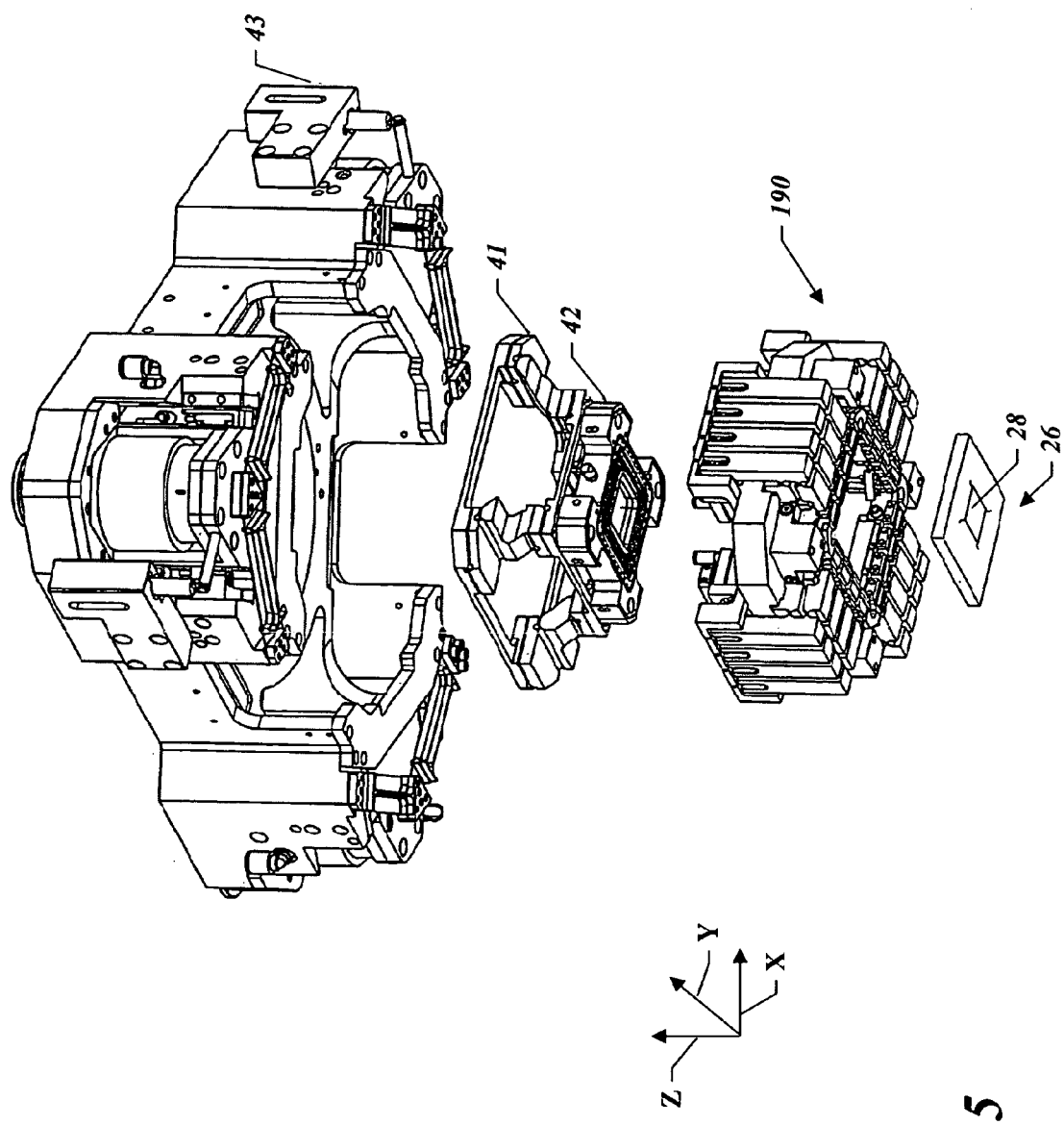
FIG. 5 is an exploded view of an imprint head, actuator sub-assembly and template in accordance with the present invention.
Figure 6:
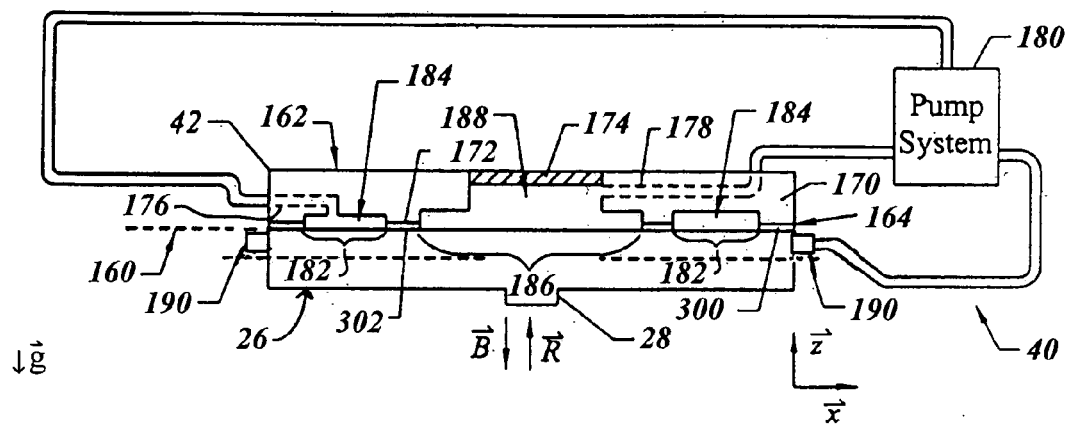
FIG. 6 is a cross-sectional view of a chucking system in accordance with the present invention.

Referring to FIGS. 5 and 6, template 26, upon which mold 28 is present, is coupled to imprint head 18, shown in FIG. 1, via chuck body 42. Body 42 is coupled to a flexure 41 that is disclosed and claimed in U.S. patent application Ser. No. 11/142,838, filed Jun. 1, 2005, entitled "Compliant Device for Nano-Scale Manufacturing", which is assigned to the assignee of the present invention. Flexure 41 is coupled to an orientation system 43 that controls movement of template 26, which is disclosed in U.S. patent application Ser. No. 11/142,825, filed Jun. 1, 2005, entitled "Method and System to Control Movement of a Body for Nano-Scale Manufacturing," which is assigned to the assignee of the present invention.

Figure 7:
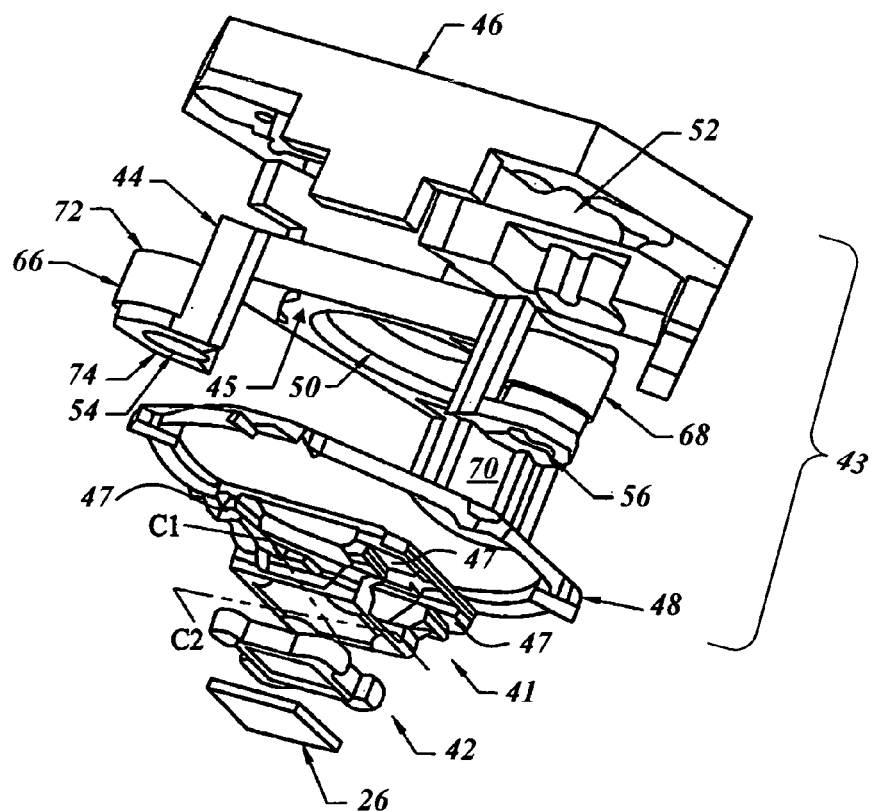
FIG. 7 is an exploded perspective view of an orientation stage showing a template chuck and a template in accordance with the present invention.

Referring to FIG. 7 orientation system 43 is shown having an inner frame 44 disposed proximate to an outer frame 46, and flexure ring 48, discussed more fully below. Body 42 is coupled to orientation system 43, shown more clearly in FIG. 8 through flexure 41. Specifically, body 42 is connected to flexure 41, using any suitable means, such as threaded fasteners (not shown) located at the four corners of body 42 connecting to four corners of flexure 41 closest to the four corners of body 42. Four corners 47 of flexure 41 that are closest to a surface 45 of inner frame 44 are connected thereto using any suitable means, such as threaded fasteners, not shown.

Figure 8:
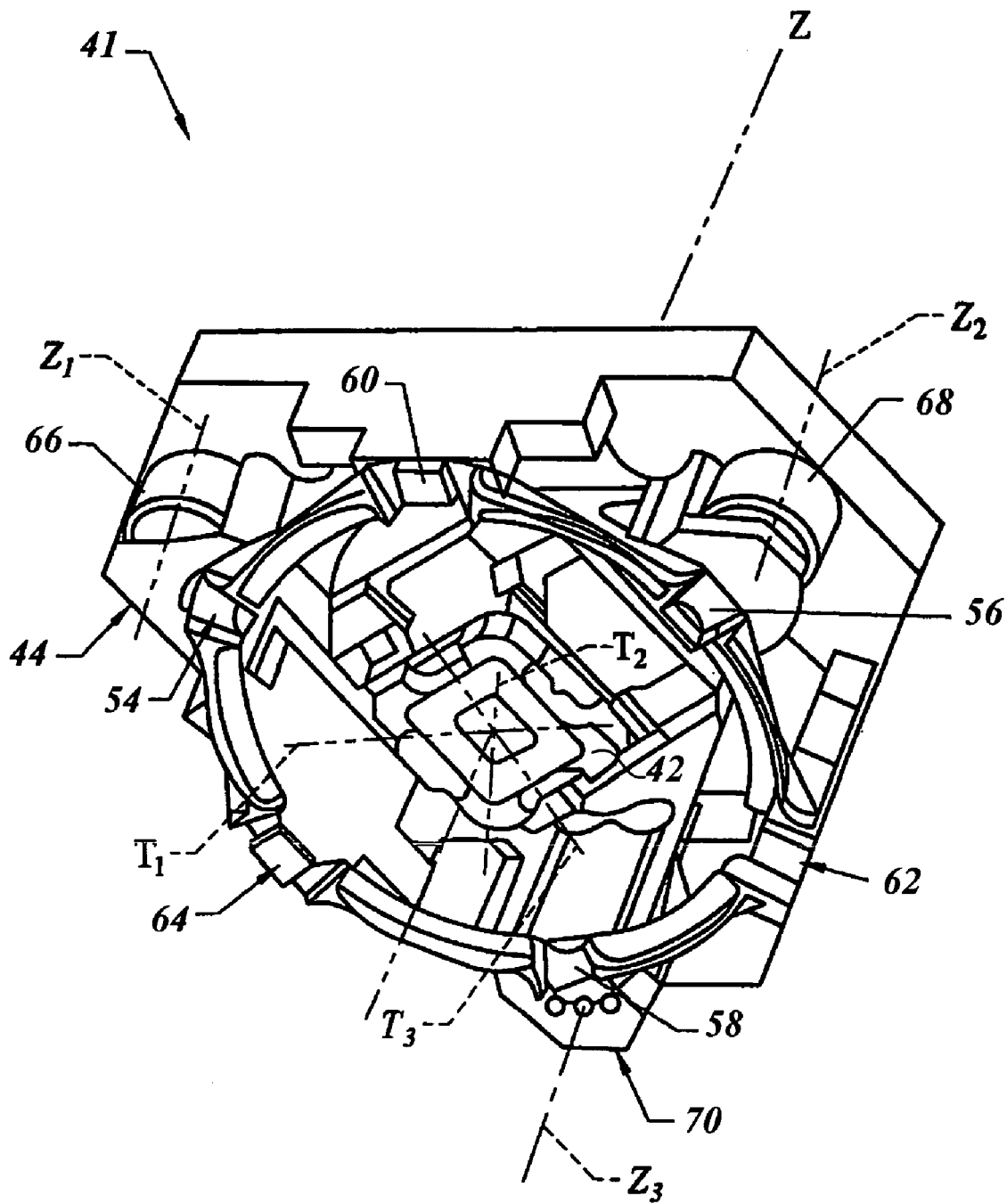
FIG. 8 is perspective view of the orientation stage shown in FIG. 7.

Referring to FIGS. 7 and 8, inner frame 44 has a central throughway 50, and outer frame 46 has a central opening 52 in superimposition with central throughway 50. Flexure ring 48 has an annular shape, e.g., circular or elliptical, and is coupled to inner frame 44 and outer frame 46 and lies outside of both central throughway 50 and central opening 52. Specifically, flexure ring 48 is coupled to inner frame 44 at regions 54, 56, and 58, outer frame 46 at regions 60, 62 and 64 using any suitable means, such as threaded fasteners (not shown). Region 60 is disposed between regions 54 and 56 and disposed equidistant therefrom; region 62 is disposed between regions 56 and 58 and disposed equidistant therefrom; and region 64 is disposed between regions 54 and 58 and disposed equidistant therefrom. In this manner, flexure ring 48 surrounds flexure 41, body 42, and template 26 and fixedly attaches inner frame 44 to outer frame 46.

It should be understood that the components of orientation system 43 and flexure 41 may be formed from any suitable material, e.g., aluminum, stainless steel and the like. Additionally, flexure 41 may be coupled to orientation system 43 using any suitable means. In the present example, flexure 41 is coupled to surface 45 employing threaded fasteners (not shown) located at the four corners of body 42.

Orientation system 43 is configured to control movement of template 26 and to place the same in a desired spatial relationship with respect to a reference surface (not shown). To that end, a plurality of actuators 66, 68 and 70 are connected between outer frame 46 and inner frame 44 so as to be spaced about orientation system 43. Each of actuators 66, 68 and 70 has a first end 72 and a second end 74. First end 72 faces outer frame 46, and second end 74 faces inner frame 44. Actuators 66, 68 and 70 tilt inner frame 44 with respect to outer frame 46 by facilitating translational motion of inner frame 44 along three axes $Z_1$, $Z_2$, and $Z_3$. Orientation system 43 may provide a range of motion of approximately ±1.2 mm about axes $Z_1$, $Z_2$, and $Z_3$. In this fashion, actuators 66, 68 and 70 cause inner frame 44 to impart angular motion to both flexure 41 and, therefore, template 26 and body 42, about one or more of a plurality of axes $T_1$, $T_2$ and $T_3$. Specifically, by decreasing a distance between inner frame 44 and outer frame 46 along axes $Z_2$ and $Z_3$ and increasing a distance therebetween along axis $Z_1$, angular motion about tilt axis $T_2$ occurs in a first direction. Increasing the distance between inner frame 44 and outer frame 46 along axes $Z_2$ and $Z_3$ and decreasing the distance therebetween along axis $Z_1$, angular motion about tilt axis $T_2$ occurs in a second direction opposite to the first direction. In a similar manner angular movement about axis $T_1$ may occur by varying the distance between inner frame 44 and outer frame 46 by movement of inner frame 44 along axes $Z_1$ and $Z_2$ in the same direction and magnitude while moving of the inner frame 44 along axis $Z_3$ in a direction opposite and twice to the movement along axes $Z_1$ and $Z_2$. Similarly, angular movement about axis $T_3$ may occur by varying the distance between inner frame 44 and outer frame 46 by movement of inner frame 44 along axes $Z_1$ and $Z_3$ in the same direction and magnitude while moving of inner frame 44 along axis $Z_2$ in direction opposite and twice to the movement along axes $Z_1$ and $Z_3$. Actuators 66, 68 and 70 may have a maximum operational force of ±200 N. Orientation System 43 may provide a range of motion of approximately ±0.15° about axes $T_1$, $T_2$, and $T_3$.

Actuators 66, 68 and 70 are selected to minimize mechanical parts and, therefore, minimize uneven mechanical compliance, as well as friction, which may cause particulates. Examples of actuators 66, 68 and 70 include voice coil actuators, piezo actuators, and linear actuators. An exemplary embodiment for actuators 66, 68 and 70 is available from BEI Technologies of Sylmar, Calif. under the trade name LA24-20-000A and are coupled to inner frame 44 using any suitable means, e.g., threaded fasteners. Additionally, actuators 66, 68 and 70 are coupled between inner frame 44 and outer frame 46 so as to be symmetrically disposed thereabout and lie outside of central throughway 50 and central opening 52. With this configuration an unobstructed throughway between outer frame 46 to flexure 41 is configured. Additionally, the symmetrical arrangement minimizes dynamic vibration and uneven thermal drift, thereby providing fine-motion correction of inner frame 44.

The combination of the inner frame 44, outer frame 46, flexure ring 48 and actuators 66, 68 and 70 provides angular motion of flexure 41 and, therefore, body 42 and template 26 about tilt axes $T_1$, $T_2$ and $T_3$. It is desired, however, that translational motion be imparted to template 26 along axes that lie in a plane extending transversely, if not orthogonally, to axes $Z_1$, $Z_2$, and $Z_3$. This is achieved by providing flexure 41 with the functionality to impart angular motion upon template 26 about one or more of a plurality of compliance axes, shown as C1 and C2, which are spaced-part from tilt axes $T_1$, $T_2$ and $T_3$ and exist on the surface of the template when the template, the template chuck, and the compliant device are assembled.

Figure 9:
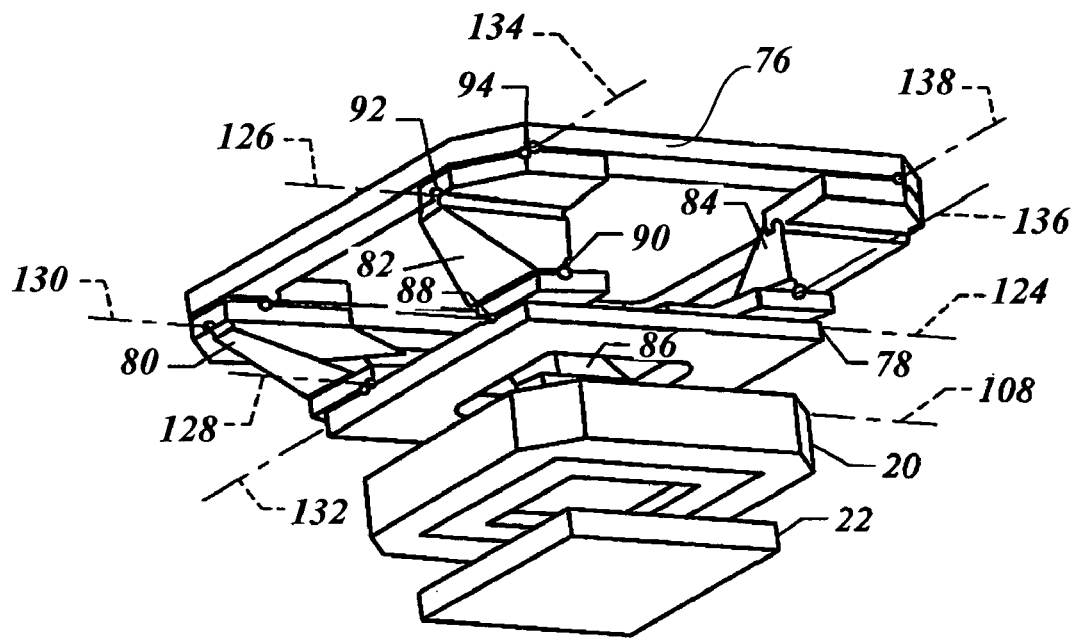
FIG. 9 is an exploded perspective view of a passive compliant device included in the orientation stage shown in FIG. 7 along with the template holder and the template in accordance with a first embodiment of the present invention.
Figure 10:
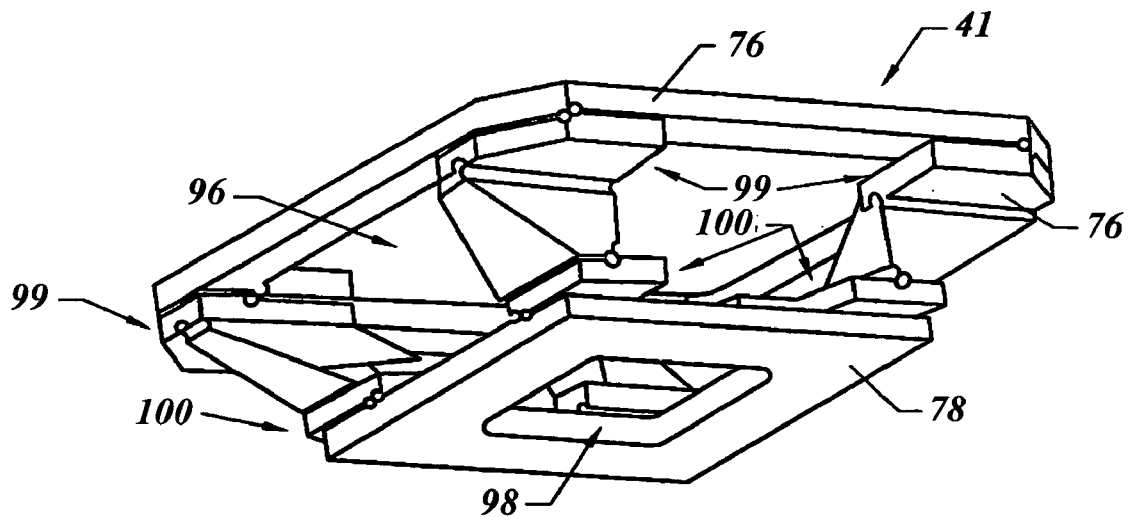
FIG. 10 is a detailed perspective view of the passive compliant device shown in FIG. 9.

Referring to FIGS. 9 and 10, flexure 41 includes a support body 76 and a floating body 78 that is coupled to the support body 76 vis-a-vis a plurality of flexure arms 80, 82, 84 and 86. Body 42 is intended to be mounted to floating body 78, as discussed above, and template 26 is retained by chucking system 40 using conventional methods, discussed more fully below, shown in FIG. 6.

Referring again to FIGS. 9 and 10, each of flexure arms 80, 82, 84 and 86 includes first and second sets of flexure joints 88, 90, 92 and 94. The first and second sets of flexure joints 88, 90, 92 and 94 are discussed with respect to flexure arm 88 for ease of discussion, but this discussion applies equally to the sets of flexure joints associated with flexure arms 80, 84 and 86. Although it is not necessary, flexure 41 is formed from a solid body. As a result, support body 76, floating body 78 and flexures arms 80, 82, 84 and 86 are integrally formed, and are rotationally coupled together vis-a-vis first and second sets of flexure joints 88, 90, 92 and 94. Support body 76 includes a centrally disposed throughway 96. Floating body 78 includes a centrally disposed aperture 98 that is in superimposition with throughway 96. Each flexure arm 80, 82, 84 and 86 includes opposed ends, 99 and 100. End 99 of each flexure arm 80, 82, 84 and 86 is connected to support body 76 through flexure joints 92 and 94. End 99 lies outside of throughway 96. End 100 of each flexure arm 80, 82, 84 and 86 is connected to floating body 78 through flexure joints 88 and 90. End 100 lies outside of aperture 98.

Referring to FIGS. 9, 10 and 11, each of joints 88, 90, 92 and 94 are formed by reducing material from flexure 41 proximate to ends 99 and 100, i.e., at an interface either of support body 76 or floating body 78 and one of flexure arms 80, 82, 84 and 86. To that end, flexure joints 88, 90, 92 and 94 are formed by machining, laser cutting or other suitable processing of flexure 41. Specifically, joints 90 and 92 are formed from a flexure member 102 having two opposing surfaces 104 and 106 and two hiatuses 108 and 110. Hiatus 108 is positioned facing away from hiatus 110, and hiatus 110 faces away from hiatus 108. Extending from hiatus 110, away from surface 104 is a gap 112, terminating in an opening in a periphery of flexure arm 82. Joint 94 is also formed from a flexure member 114 having two opposing surfaces 116 and 118 and two hiatuses 120 and 122. Hiatus 122 is disposed opposite to surface 118. Extending from hiatus 122, away from surface 116 is a gap 123, and extending from hiatus 120 is a gap 125. The spacing $S_1$, $S_2$ and $S_3$ of gaps 112, 123, and 125, respectively define a range of motion over which relative movement between either of support body 76 and floating body 78 may occur.

Referring to FIGS. 9 and 11, flexure member 114 associated with joints 88 of flexure arms 82 and 84 facilitates rotation about axis 124, and flexure member 102 associated with joints 92 of flexure arms 82 and 84 facilitates rotation about axis 126. Flexure member 114 associated with joints 88 of flexure arms 80 and 86 facilitates rotation about axis 128, and flexure member 102 associated with joints 92 of flexure arms 80 and 86 facilitates rotation about axis 130. Flexure member 102 associated with joints 90 of flexure arms 80 and 82 facilitates rotation about axis 132, and flexure member 114 associated with joints 94 of flexure arms 80 and 82 facilitates rotation about axis 134. Flexure member 102 associated with joints 90 of flexure arms 84 and 86 facilitates rotation about axis 136, and flexure member 114 associated with joints 94 of flexure arms 84 and 86 facilitates rotation about axis 138.

As a result, each flexure arm 80, 82, 84 and 86 is located at a region of flexure 41 where groups of the axes of rotation overlap. For example, end 99 of flexure arm 80 is located where axes 130 and 134 overlap and end 100 is positioned where axes 128 and 132 overlap. End 99 of flexure arm 82 is located where axes 126 and 134 overlap, and end 100 is positioned where axes 124 and 132 overlap. End 99 of flexure arm 84 is located where axes 138 and 126 overlap, and end 100 is located where axes 124 and 136 overlap. Similarly, end 98 of flexure arm 86 is located where axes 130 and 138 overlap, and end 100 is located where axes 136 and 128 overlap.

As a result of this configuration, each flexure arm 80, 82, 84 and 86 is coupled to provide relative rotational movement with respect to support body 76 and floating body 78 about two groups of overlapping axes with a first group extending transversely to the remaining group. This provides each of flexure arms 80, 82, 84 and 86 with movement about two groups of orthogonal axes while minimizing the footprint of the same. Flexure 41 may provide a tilting motion range of approximately ±0.04°, an active tilting motion range of approximately ±0.02°, and an active theta motion range of approximately ±0.0005° above the above mentioned axes. Furthermore, having the reduced footprint of each flexure arm 80, 82, 84 and 86 allows leaving a void between throughway 96 and aperture 98 unobstructed by flexure arms 80, 82, 84 and 86. This makes flexure 41 suited for use with an imprint lithography system.

Referring to FIGS. 10, 12 and 13, the present configuration of flexure arms 80, 82, 84 and 86 with respect to support body 76 and floating body 78 facilitates parallel transfer of loads in flexure 41. For example, were a load force imparted upon support body 76, each flexure arm 80, 82, 84 and 86 imparts a substantially equal amount of force F1 upon floating body 78. Among other things, this facilitates obtaining a desired structural stiffness with flexure 41 when loaded with either a force $F_1$ or a force $F_2$. To that end, joints 88, 90, 92 and 94 are revolute joints which minimize movement, in all directions, between flexure 41 and either support body 76 or floating body 78 excepting rotational movement. Specifically, joints 88, 90, 92 and 94 minimize translational movement between flexure arms 80, 82, 84 and 86, support body 76 and floating body 78, while facilitating rotational movement about axes 124, 126, 128, 130, 132, 134, 136 and 138.

Referring to FIGS. 10, 11, 12 and 13, the relative position of axes 124, 126, 128 and 130 provides floating body 78 with a first remote center of compliance (RCC) at a position 140 spaced-apart from floating body 78, centered with respect to aperture 98 and axes 124, 126, 128 and 130. Similarly, the relative position of axes 122, 124, 136 and 138 provides floating body 78 with a second RCC substantially close to position 140 and desirably located at position 140, which is substantially centered with respect to axes 132, 134, 136 and 138 and is positioned equidistant from position 140. Each axis of the group of axes 124, 126, 128 and 130 extends parallel to the remaining axes 124, 126, 128 and 130 of the group. Similarly, each axis of the group of axes 132, 134, 136 and 138 extends parallel to the remaining axes 132, 134, 136 and 138 of the group and orthogonally to each axis 124, 126, 128 and 130. Axis 130 is spaced-apart from axis 128 along a first direction a distance $d_1$ and along a second orthogonal direction a distance $d_2$. Axis 124 is spaced-apart from axis 126 along the second direction a distance $d_3$ and along the first direction a distance $d_4$. Axis 132 is spaced-apart from axis 134 along a third direction, that is orthogonal to both the first and second directions a distance $d_5$ and along the first direction a distance $d_6$. Axis 136 is spaced-apart from axis 138 along the first direction a distance $d_7$ and along the third direction a distance $d_8$. Distances $d_1$, $d_4$, $d_6$ and $d_7$ are substantially equal. Distances $d_2$, $d_3$, $d_5$ and $d_8$ are substantially equal.

Referring to FIGS. 12, 13, 14 and 15, two sets of transversely extending axes may be in substantially close proximity such that RCC may be considered to lie upon an intersection thereat by appropriately establishing distances $d_1$-$d_8$. A first set of includes four axes is shown as 144, 146, 148 and 150. Joints 88 and 92 of flexure arm 80 lie along axis 144, and joints 88 and 92 of flexure arm 82 lie along axis 146. Joints 88 and 92 of flexure arm 84 lie along axis 148, and joints 88 and 92 of flexure arm 86 lie along axis 150. A second set of four axes is shown as 152, 154, 156, and 158. Joints 90 and 94 of flexure arm 82 lie along axis 152, and joints 90 and 94 of flexure arm 84 lie along axis 154. Joints 90 and 94 of flexure arm 86 lie along axis 156, and joints 90 and 94 of flexure arm 80 lie along axis 158. With this configuration, movement of floating body 78, with respect to RCC, about any one of the set of axes 144, 146, 148, 150, 152, 154, 156, and 158 is decoupled from movement about the remaining axes 144, 146, 148, 150, 152, 154, 156, and 158. This provides a gimbal-like movement of floating body 78 with respect to RCC with the structural stiffness to resist, if not prevent, translational movement of floating body 78 with respect to axis 144, 146, 148, 150, 152, 154, 156, and 158.

Referring to FIGS. 6 and 16, chuck body 42 is adapted to retain template 26, upon which mold 28 is attached, employing vacuum techniques. To that end, chuck body 42 includes first 160 and second 162 opposed sides. A side, or edge, surface 164 extends between first side 160 and second side 162. First side 160 includes a first recess 166 and a second recess 168, spaced-apart from first recess 166, defining first 170 and second 172 spaced-apart support regions. First support region 170 cinctures second support region 172 and the first 166 and second 168 recesses. Second support region 172 cinctures second recess 168. A portion 174 of chuck body 42 in superimposition with second recess 168 is transparent to energy having a predetermined wavelength, such as the wavelength of the actinic energy mentioned above. To that end, portion 174 is made from a thin layer of transparent material, such as glass. However, the material from which portion 174 is made may depend upon the wavelength of energy produced by source 22, shown in FIG. 2.

Referring again to FIGS. 6 and 16, portion 174 extends from second side 162 and terminates proximate to second recess 168 and should define an area at least as large as an area of mold 28 so that mold 28 is in superimposition therewith. Formed in chuck body 42 are one or more throughways, shown as 176 and 178. One of the throughways, such as throughway 176, places first recess 166 in fluid communication with side surface 164. The remaining throughway, such as throughway 178, places second recess 168 in fluid communication with side surface 164.

It should be understood that throughway 176 may extend between second side 162 and first recess 166, as well. Similarly, throughway 178 may extend between second side 162 and second recess 168. What is desired is that throughways 176 and 178 facilitate placing recesses 166 and 168, respectively, in fluid communication with a pressure control system, such as a pump system 180.

Pump system 180 may include one or more pumps to control the pressure proximate to recesses 166 and 168, independently of one another. Specifically, when mounted to chuck body 42, template 26 rests against first 170 and second 172 support regions, covering first 166 and second 168 recesses. First recess 166 and a portion 182 of template 26 in superimposition therewith define a first chamber 184. Second recess 168 and a portion 186 of template 26 in superimposition therewith define a second chamber 188. Pump system 180 operates to control a pressure in first 184 and second 188 chambers. Specifically, the pressure is established in first chamber 184 to maintain the position of the template 26 with the chuck body 42 and reduce, if not avoid, separation of template 26 from chuck body 42 under force of gravity g. The pressure in the second chamber 188 may differ from the pressure in the first chamber 184 to, inter alia, reduce distortions in the template 26 that occur during imprinting, by modulating a shape of template 26. For example, pump system 180 may apply a positive pressure in chamber 188 to compensate for any upward force R that occurs as a result of imprinting layer 34, shown in FIG. 2, contacting mold 28. In this manner, produced is a pressure differential between differing regions of side 160 so that bowing of template 26 and, therefore, mold 28 under force R is attenuated, if not avoided. Coupled to template 26 is a means for varying dimensions of the same in X and Y directions, with the understanding that the Y-direction is into the plane of FIG. 6. The means for varying dimensions is shown schematically as an actuator sub-assembly 190, which is coupled to chuck body 42, shown in exploded view in FIG. 5. Pump system 180 and actuator sub-assembly 190 are operated under control of processor 31, shown in FIG. 1.

Figure 17:
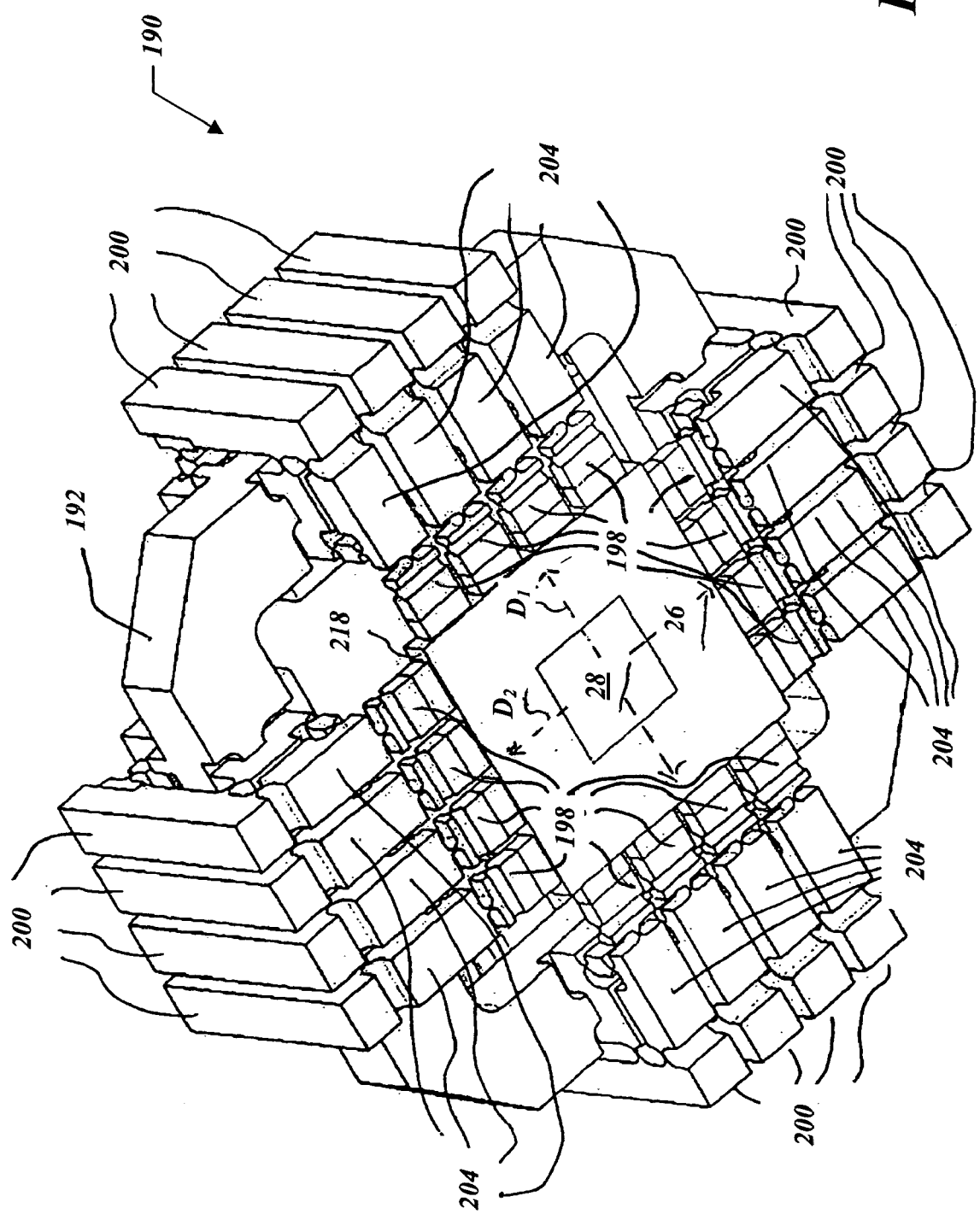
FIG. 17 is a bottom-up perspective view of an apparatus, shown in FIG. 5, used to vary dimensions of a template.
Figure 18:
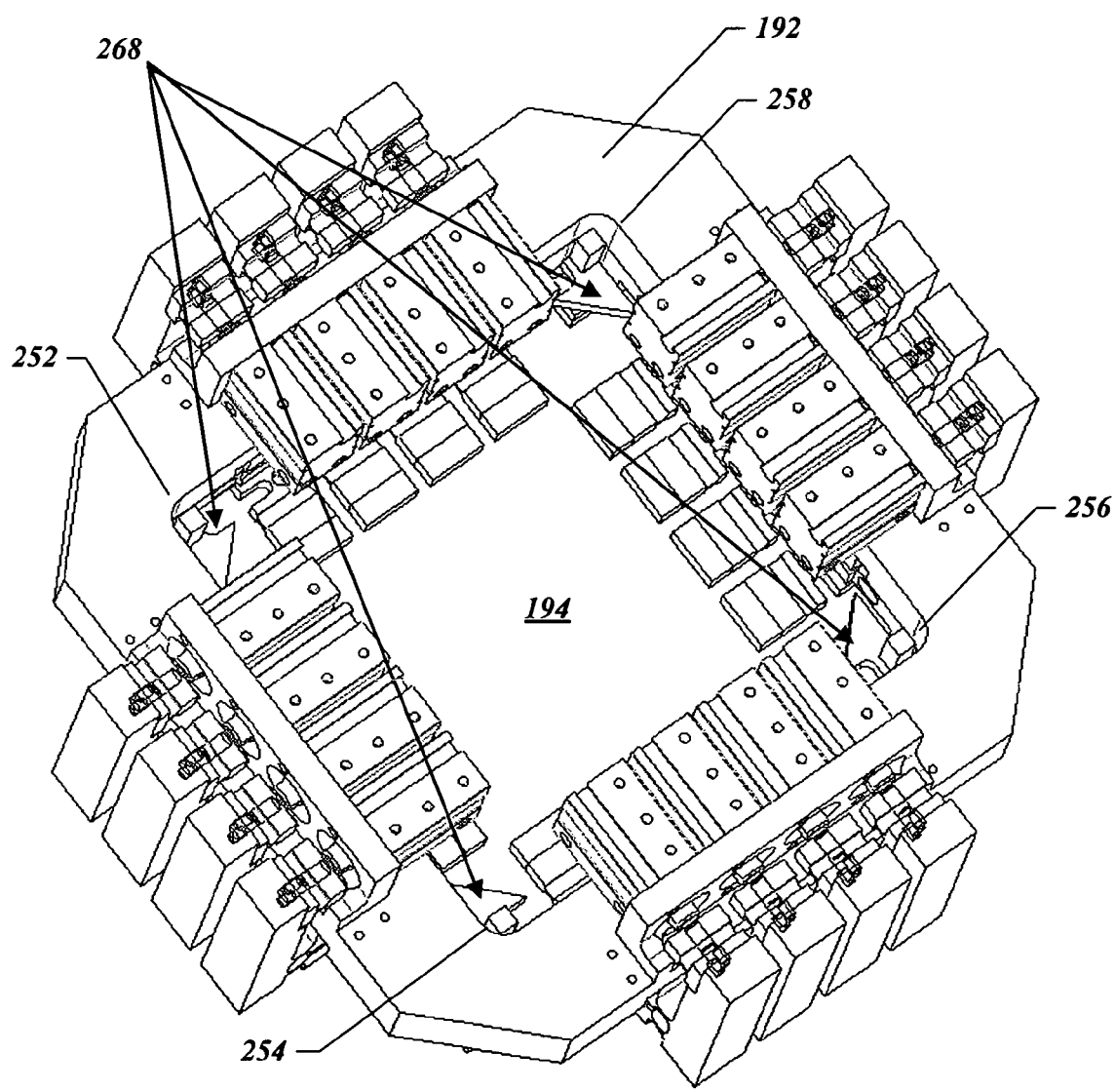
FIG. 18 is top-down perspective view of the apparatus shown in 17.
Figure 19:
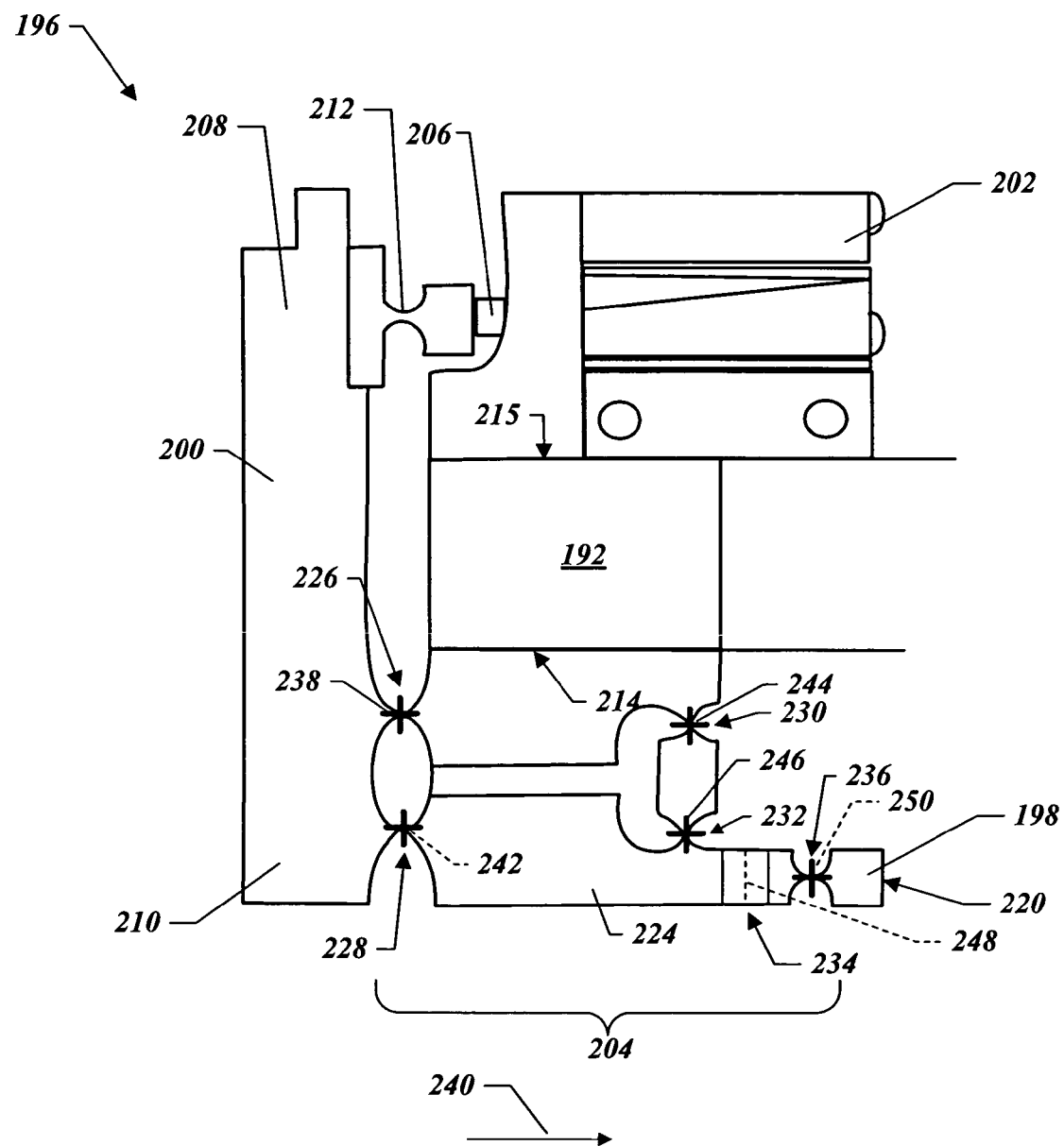
FIG. 19 is detailed side view of a lever sub-assembly, shown in FIGS. 17 and 18, in accordance with the present invention.

Referring to FIGS. 17-19, in the present example actuator sub-assembly 190 is configured to subject template 26 to purely compressive forces so that out-of-plane bending forces are substantially minimized, if not avoided entirely. Forces causing bending of template 26 are problematic in that the same results in pattern distortion. To that end, actuator sub-assembly 190 includes a plurality of lever sub-assemblies mounted to a frame 192 having a central aperture 194 to direct compressive forces along a neutral axis of template 26. Each of lever sub-assemblies 196 includes a body 198 coupled to a lever arm 200, an actuation system 202 and a linkage system 204. Lever arm 200 is coupled to body 198 through linkage system 204. Typically, lever arm 200, body 198 and linkage system 204 are integrally formed from a solid material, e.g., aluminum, stainless steel and the like. A piston 206 of actuation system 202 is coupled to a terminus region 208 of lever arm 200 through a flex joint 212 and may push or pull against terminus region 208. A second terminus region 210 of lever arm 200 is coupled to linkage system 204 to impart a force thereon.

Each of lever sub-assemblies 196 is mounted to frame 192 so that linkage system 204 is positioned on a first side 214 of frame 192. Frame 192, as are most if not all of the metallic components of sub-assembly 190, is formed from aluminum, stainless steel or the like. Actuation system 202 is positioned on a second side 215 of frame 192, disposed opposite to first side 214, with lever arm 200 extending therebetween. Although actuation system 202 may be any force or displacement actuator known in the art, such as pneumatic, piezoelectric, magnetostrictive, voice coils, in the present example actuation system is an actuator available from SMC Corporation of America located in Indianapolis, Ind. under the product number 11-CUJB10-4D.

Each body 198 of lever sub-assemblies 196 extends from linkage system 204 away from lever arm 200 toward aperture 194 and terminates in superimposition therewith. Although it is not necessary, it is desirable to have the plurality of lever sub-assemblies 196 coupled to frame 192 so that the plurality of bodies 198 associated therewith are symmetrically disposed with respect to aperture 194. Furthermore, it may be desirable to have the plurality of lever sub-assemblies 196 coupled to frame 192 such that the same may impart the aforementioned force on a common frame, i.e., frame 192. Alternatively, sub-assemblies may be coupled to differing frames, but it is desirable that opposed sub-assemblies be coupled to a common frame. Although aperture 194 may have any shape desired, typically aperture 194 has a shape complementary to the shape of template 26. To that end, and as shown, aperture 194 is square. Further, it is desired that each of the plurality of bodies 198 be disposed opposite one of the remaining bodies 198 of the plurality of bodies 198. To that end, there are an equal number of bodies 198 on opposing sides of aperture 194. Although four lever sub-assemblies 196 are shown, providing four bodies 198 to a side of aperture 194, any number may be present. More specifically, each lever sub-assembly 196 may be made smaller such that a greater number of lever sub-assemblies 196 may be employed to provide a finer precision of the distortion control of template 26. In this manner, an area is defined between the plurality of bodies 198 in which template 26 may be centered. An advantage with the present design is that the entire actuator sub-assembly 190 is positioned to lie on one side of mold 28 so as to be spaced-apart from a plane in which mold surface 39, shown in FIG. 3, lies. This is beneficial in preventing contact between the components of actuator sub-assembly 190, shown in FIG. 5, and a wafer 30, shown in FIG. 3, during imprint processes.

Referring again to FIGS. 17-19, during operation, actuator sub-assembly 190 applies a force to terminus region 208 to provide aperture 194 with appropriate dimensions to receive template 26. For example, in a neutral state, i.e., without the force being applied by actuator sub-assembly 190, aperture 194 may have dimensions that are smaller than the dimensions of template 26. As a result, actuator sub-assembly 190 may operate to pull against terminus region 208 and cause retraction of body 198 away from an opposing body 198 to increase the size of aperture 194 for loading of template 26. Template 26 is disposed within aperture 194 and held in place via chucking system 40, shown in FIG. 6. Referring again to FIGS. 5, 17, 18 and 19, body 198 is allowed to press against template 26 without force being generated by actuation system 202. Alternatively, the size of aperture 194 may be greater than the dimension of template 26, requiring a force to be generated by actuation system 202 to achieve contact between template 26 and body 198.

Bodies 198 are arranged so that a contact surface 220 is included in body 198 to contact a side 218 of template 26. Specifically, a contact surface 220 is configured to extend parallel to side 218 and make contact therewith. To that end, actuation system 202 is coupled to pump system 180, shown in FIG. 6, to cause actuation system 202 to impart angular movement of lever arm 200. Piston 206 imparts a force $F_{IN}$ upon one end of lever arm 200 through flexure joint 212. This causes lever arm 200 to undergo rotational movement that causes body 198 to undergo translational movement toward template 26, thereby decreasing the area defined by the plurality of bodies 198. In this manner, a force $F_{OUT}$ is imparted upon side 218 of template 26. By appropriately imparting $F_{OUT}$ from one or more bodies 198 along differing portions of side 218 of template 26, dimensional variations of template 26 may be achieved. The dimensional variations of template 26 are imparted upon mold 28, which may be employed to compensate for magnification errors, discussed more fully below.

An important consideration when varying the dimensions of template 26 is to minimize, if not avoid, localized force concentrations upon template 26 and bending of template 26, both of which will result in distortions in the pattern of mold 28. To that end, linkage 204 is designed to control the direction of travel of body 198 and lever arm 200. Additionally the structural connection of sub-assemblies 196 to common frame 192 ensures that high forces are reacted in frame 192, as opposed to other components, such as chuck body 42 and, therefore, template 26.

Linkage 204 includes a linkage member 224 and a plurality of flexure joints, shown as 226, 228, 230, 232, 234 and 236. Each of flexure joints 226, 228, 230, 232, 234 and 236 are regions of material of linkage member 224, that has substantially reduced material. Flexure joint 226 defines a pivot axis 238 about which lever arm 200 undergoes rotational/angular movement in response to force $F_{IN}$ imparted upon lever arm 200 by piston 206 of actuation system 202 at terminus region 208. The rotational/angular movement of lever arm 200 about pivot axis 238 causes body 198 to move in a direction 240 that is transverse, if not orthogonal, to pivot axis 238. It is highly desired that direction 240 is precisely controlled so that deviation therefrom is minimized. This reduces, if not avoids, out-of-plane bending of template 26 upon being subjected to force $F_{OUT}$ by the plurality of bodies 198. Force $F_{OUT}$ is directed along terminus region 210 of lever arm 200 onto linkage system 204.

Flexure joints 228, 230, and 232 in addition to flexure joint 226 facilitate rotational/angular movement between lever arm 200 and body 198 while ensuring that deviation of body 198 from direction 240 is minimized. Specifically, each of flexure joints 228, 230, and 232 defines an axis of rotation, 242, 244, and 246, respectively, about which rotational/angular movement between lever arm 200 and body 198 may occur. Axes 238, 242, 244, and 246 extend parallel, with axes 238 and 242 being substantially in superimposition with one another and axes 244 and 246 being substantially in superimposition with one another. Axes 238 and 244 lie in a common plane and axes 242 and 246 lie in a common plane.

Additionally, by properly positioning axis 238 between terminus regions 208 and 210, lever arm 200 and linkage 204 may function as an amplifier. Specifically, when contact between side 218 and contact surface 220 exists, the force $F_{out}$ applied to linkage system 204 is a function of force $F_{IN}$ and the position of axis 238 between terminus regions 208 and 210. The magnitude of $F_{OUT}$ may be defined as follows:

$$F_{OUT} = F_{IN}(l_1/l_2)$$

where $l_1$ is a distance of axis 212 from terminus region 208, and $l_2$ is a distance of axis 238 from terminus region 210.

Figure 20:
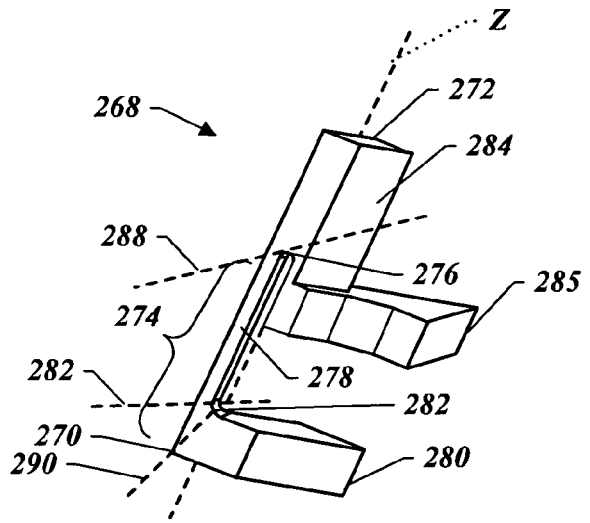
FIG. 20 is an exploded perspective view of the actuator sub-assembly, flexure device, shown in FIG. 5, with pivots in accordance with the present invention.
Figure 21:
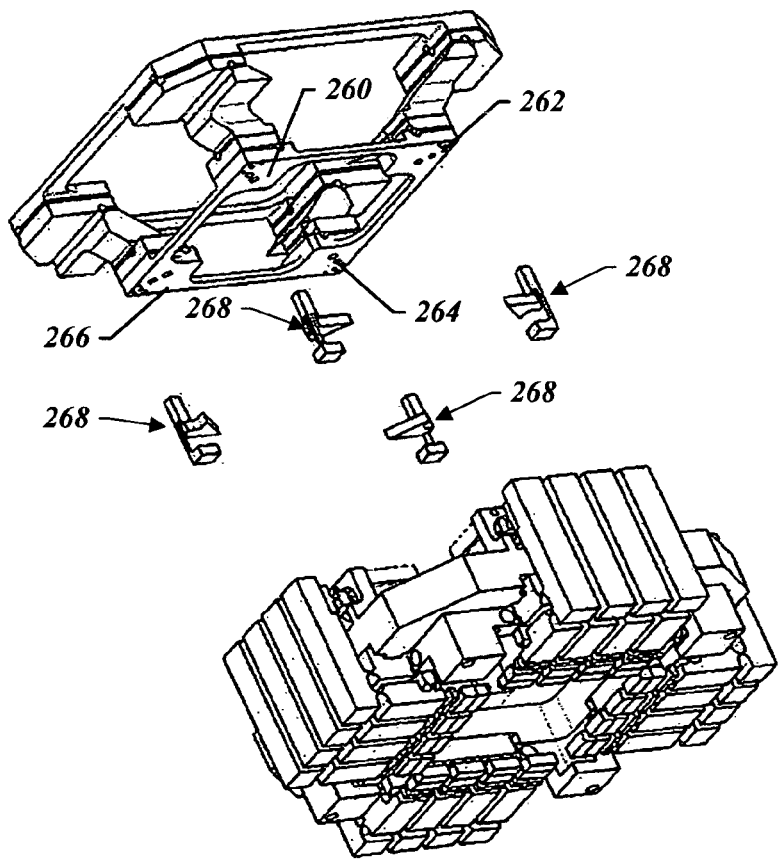
FIG. 21 is a detailed perspective view of one of the pivots shown in FIG. 20.

Referring to FIGS. 19 and 20, in furtherance of maintaining pure compression on template 26, linkage system 204 includes joints 234 and 236. Joints 234 and 236 facilitate rotational/angular movement of body 198 with respect to lever member 224 along two transversely extending axes 248 and 250. By providing body 198 with rotational freedom about axes 248 and 250, body 198 may change position to compensate for obliqueness of side 218 with respect to contact surface 220. In this manner, contact surface 220 will maintain contact with side 218 so as to reduce, if not prevent, localized stresses resulting from, inter alia, having a corner of contact surface 220 contacting side 218. To further reduce localized stresses between contact surface 220 and template 26, contact surface 220 may be formed from a compliant material, so that localized stresses on side 218 resulting from non-conformity of contact surface 220 with side 218 is minimized. Exemplary materials from which contact surface may be formed include TEFLON®, fluorosilicone, urethane and Delrin/AF. Further compliance with surface anomalies of side 218 may be achieved by allowing independent control over body 198, one among the plurality of bodies 198, and, therefore, contact surface 220.

Actuator sub-assembly 190 facilitates varying dimensions of template 26 in two dimensions. This is particularly useful in overcoming Poisson's effect. Poisson's effect may result in linear coupling of strain in orthogonal directions of template 26. Specifically, the Poisson ratio is the ratio between the tensile strain caused in the Y and Z directions in template 26 to the compressive strain imparted to template 26 in the X direction. Typical numbers are in the range of 0.1-0.4. Were template 26 formed from fused silica, the ratio would be approximately 0.16. A dimensional change that is purely in the X direction, therefore, i.e., with no dimensional change in the Y direction being desired, may necessitate activation of actuator sub-assembly 190 to vary both distances $d_1$ and $d_2$, to compensate for Poisson's effect. With any of the above-described configurations of actuator sub-assembly 190, a force may be applied to template 26 to vary the dimensions of the same and reduce distortions in the pattern recorded into imprinting layer 34, shown in FIG. 2.

Referring to FIGS. 1, 5, 18, 20 and 21 another important consideration when varying template dimensions is to minimize the deleterious effects of the forces employed. For example, when varying template dimensions, forces on the order of hundreds of pounds may be exerted. It is desirable to minimize the amount of these forces felt on other units of system 10, such as orientation system 43. In addition, it is desirable that template 26 neither rotate with respect to chuck body 42 about the Z-axis nor become displaced along the X and Y directions with respect to body 42, such as in the presence of unequal compression forces exerted upon side 218 by bodies 198. To that end, actuator sub-assembly 190 is pivotally/elastically coupled to flexure 41 to move in a plane along X and Y directions and rotate about the Z direction in response to reaction forces generated when actuator sub-assembly compresses template 26. Specifically, the force by which template 26 is held against chuck body 42 minimizes, if not prohibits, bulk and rotational movement of template 26 with respect to chuck body 42 in the presence of compression forces. This is accomplished by coupling each corner 252, 254, 256 and 258, of actuator sub-assembly 190 to a corner 260, 262, 264 and 266, of flexure 41 through a pliant member 268 using any suitable fastening means, such as threaded fasteners (not shown).

As shown, each pliant member 268 includes opposed termini 270 and 272 with a dual fulcrum lever system 274 extending from terminus 270 toward terminus 272, terminating in a fulcrum 276. Fulcrum 276 is located between opposed termini 270 and 272. Fulcrum lever system 274 includes a lever 278, extending from fulcrum 276, along direction Z toward terminus 270, terminating in a base 280. Base 280 is coupled to lever 278 defining a fulcrum 282 thereat. Base 280 extends from fulcrum 282, transversely to direction Z. Extending from fulcrum 276 is a support 284 that terminates in a base 285. Support 284 extends from fulcrum 276 toward terminus 270 and is disposed opposite to, and spaced apart from, lever 278. Base 285 extends from support 284 away from lever 278 and is positioned in superimposition with, and spaced apart from, base 280.

Base 280 is fixedly attached to actuator sub-assembly 190, and base 285 is fixedly attached to flexure 41. To that end, a plurality of threaded fasteners (not shown) is coupled to each of base 285 and base 280. With this configuration, relative movement between actuator sub-assembly 190 and flexure 41 is facilitated. Having one pliant member 268 coupling together each pair of corners, i.e., one of the corners of flexure 41 with one of the corners of actuator sub-assembly 190, allows each lever 278 to function as a parallel four-bar linkage in space. This provides the actuator sub-assembly 190 with relative translational movement, with respect to flexure 41, along the X and Y directions, as well as rotational about the Z direction. Specifically, fulcrum 276 facilitates relative movement about axis 288, and fulcrum 282 facilitates relative movement about axis 290. In addition, relative rotational movement about axis Z is facilitated by lever 278. The rigidity of lever 278 minimizes, if not prevents, translational movement along the Z direction. Providing the aforementioned relative movement between actuator sub-assembly 190 and flexure 41 minimizes the amount of magnification forces that is sensed by other features of the system 10, e.g., flexure 41 and system 42 among others.

Additionally, actuator sub-assembly 190 is allowed to accommodate loading tolerances and unequal forces between template 26 and actuator sub-assembly 190. For example, were template 26 loaded on body 42 with theta error, e.g., not properly aligned rotationally about the Z direction with respect to chuck body 42, then the actuator sub-assembly 190 might rotate about the Z direction to accommodate for the misalignment. In addition, were the sum of the forces applied to template 26 by opposing bodies 198 not to cancel, the actuator sub-assembly 190 would accommodates for non-equilibrium of the forces applied by moving in the X and/or Y directions and/or rotating about the Z direction.

For example, it is desired that each of the plurality of lever sub-assemblies 196 operate independently of the remaining lever sub-assemblies 196 so that the sum of the magnification forces applied to template 26 in each direction is zero. To that end the following is satisfied:

$$F_{xi} + F_{x(i+1)} + \ldots F_{x(i+n)} = 0 \quad (1)$$

$$F_{yi} + F_{y(i+1)} + \ldots + F_{y(i+n)} = 0 \quad (2)$$

$$\Sigma(M_{zi}) = 0 \quad (3)$$

where i is an integer number, $F_x$ is a force in the X direction, $F_y$ is a force in the Y direction and $M_z$ is the moment of the forces $F_x$ and $F_y$ about the Z-axis. A large number of combinations of forces can be applied to template 26 obeying the above constraints. These combinations can be used to correct for magnification and distortion errors.

In a further embodiment, to provide better distortion control of template 26, the area of template 26 may be increased such that a greater number of lever sub-assemblies 196 may be employed to apply compressive forces to template 26. The larger number of lever sub-assemblies 196 allow a finer precision of the distortion control of template 26. To that end, a subset of, or each of, lever sub-assemblies 196 may be constructed to have bodies 198 of smaller dimensions to increase the number thereof coupled to side 218. In this manner, improved distortion correction may be achieved due to the increased resolution of correction afforded by increasing a number of bodies 198 on side 218. Alternatively, the area of side 218 may be increased, requiring appropriate scaling of actuator sub-assemblies 190 to accommodate template 26 of increased size. Another advantage of increasing the size of template 26 is that the area of template 26 outside of mold 28 filters, e.g., attenuates, deleterious effects of stress concentrations of bodies 198 on side 218. The stress concentration creates strain variations at mold 28, which results in pattern distortions in the pattern on mold 28. In short, it may be realized that the number of bodies 198 per unit area of side 218 is proportional to the resolution of distortion correction. Furthermore, decreasing the area of mold 28 with respect to the remaining regions of template 26 reduces the pattern distortions caused by bodies 198 contacting side 218.

Referring to FIGS. 1 and 2, distortions in the pattern recorded into imprinting layer 34 may arise from, inter alia, dimensional variations of imprinting layer 34 and wafer 30. These dimensional variations may be due in part to thermal fluctuations, as well inaccuracies in previous processing steps that produce what is commonly referred to as magnification/run-out errors. The magnification/run-out errors occur when a region of wafer 30 in which the original pattern is to be recorded exceeds the area of the original pattern. Additionally, magnification/run-out errors may occur when the region of wafer 30, in which a pattern is to be recorded, has an area smaller than the original pattern. The deleterious effects of magnification/run-out errors are exacerbated when forming multiple layers of imprinted patterns, shown as imprinting layer 292 in superimposition with patterned surface 294, shown in FIG. 4. Proper alignment between two superimposed patterns is difficult in the face of magnification/run-out errors in both single-step full wafer imprinting and step-and-repeat imprinting processes. To achieve proper alignment an interferometric analysis may be undertaken to generate control signals operated on by processor 31, shown in FIG. 1, as disclosed in U.S. patent application Ser. No. 11/000,331 filed Nov. 4, 2004, entitled "Interferometric Analysis For Manufacture Of Nano-Scale Devices," having Pawan K. Nimmakayala, Tom H. Rafferty, Alireza Aghili, Byung-Jin Choi, Philip D. Schumaker, Daniel A. Babbs, and Sidlgata V. Sreenivasan listed as inventors, in which is incorporated by reference herein.

Figure 22:
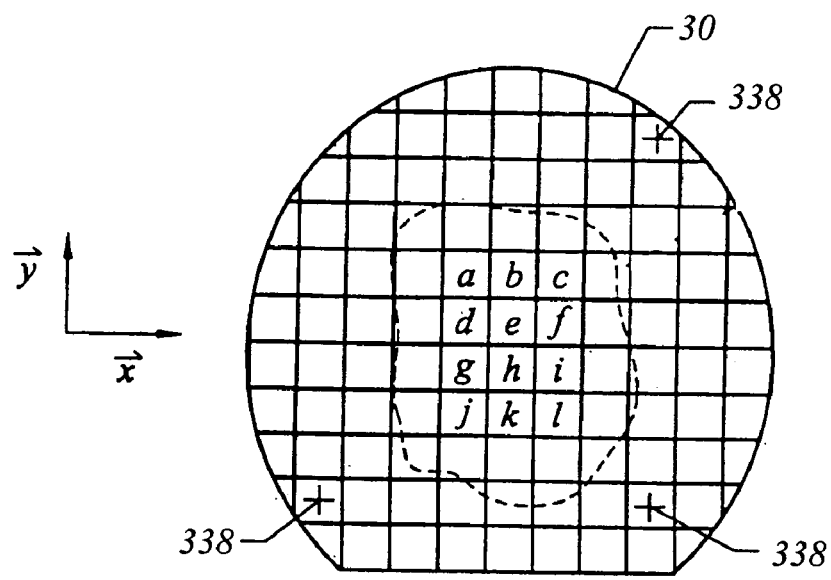
FIG. 22 is a top-down view of a wafer, shown in FIGS. 2, 3 and 4, upon which imprinting layers are disposed.
Figure 23:
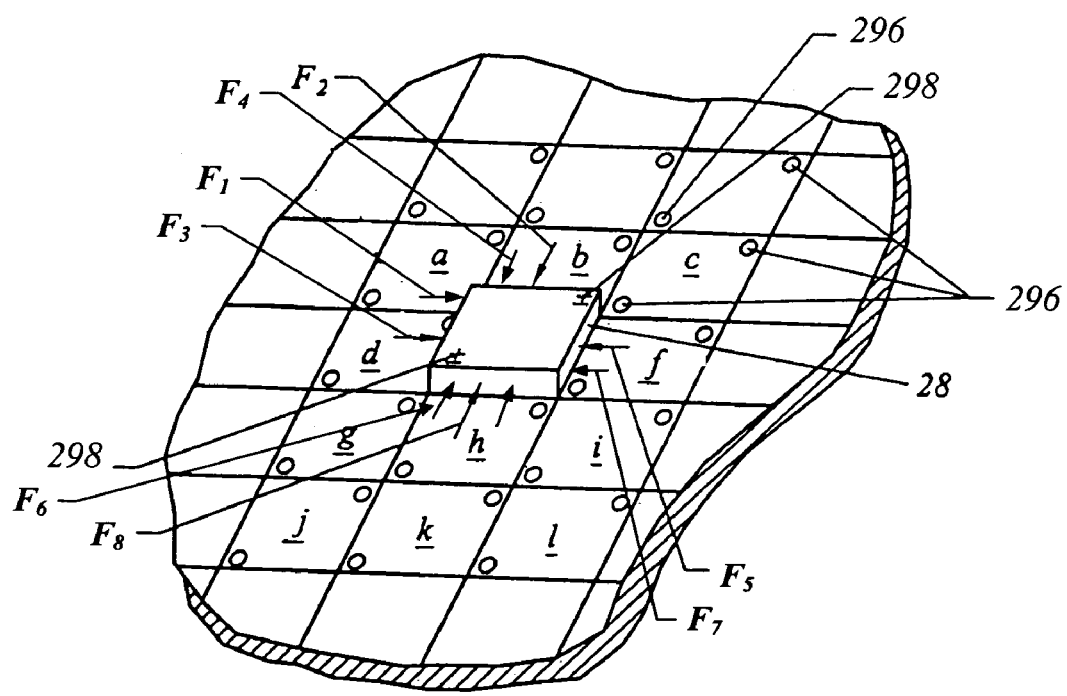
FIG. 23 is a detailed view of FIG. 22 showing the position of the mold in one of the imprint regions.

Referring to FIGS. 22 and 23, a step-and-repeat process includes defining a plurality of regions, shown as, a-1, on wafer 30 in which a pattern corresponding to the original on mold 28 will be recorded. The original pattern on mold 28 may be coextensive with the entire surface of mold 28, or simply located on a sub-portion thereof. The present invention will be discussed with respect to the original pattern being coextensive with the surface of mold 28 that faces wafer 30. Step-and-repeat imprint lithography processes may be achieved in a variety of manners. For example, the entire surface of wafer 30 may be coated with droplets 36, shown in FIG. 2, of imprinting material so that mold 28 may be sequentially placed in contact therewith at each region a-1. To that end, each region a-1 would include the requisite volume of imprinting material so that the same would not egress into adjacent regions a-1 upon being patterned by mold 28 and subsequently solidified, as discussed above. In this technique all the imprinting material required to pattern regions a-1 is deposited over the surface of wafer before solidification and imprinting material in any of regions a-1. Alternatively, a sub-portion of regions a-1, e.g., one of regions a-1, may be provided with imprinting material that is subsequently patterned and solidified before remaining regions of a-1 are provided with any imprinting material. In yet another embodiment, the entire surface of wafer may be provided with imprinting material deposited employing spin-coating techniques followed by sequentially patterning and solidifying imprinting material in each of regions a-1.

Proper execution of a step-and-repeat process may include proper alignment of mold 28 with each of regions a-1. To that end, mold 28 includes alignment marks 298, shown as a "+" sign. One or more of regions a-1 include fiducial marks 296. By ensuring that alignment marks 298 are properly aligned with fiducial marks 296, proper alignment of mold 28 with one of regions a-1 in superimposition therewith is ensured. To that end, machine vision devices (not shown) may be employed to sense the relative alignment between alignment marks 298 and fiducial marks 296. In the present example, proper alignment is indicated upon alignment marks 298 being in superimposition with fiducial marks 296. With the introduction of magnification/run-out errors, proper alignment becomes very difficult.

However, in accordance with one embodiment of the present invention, magnification/run-out errors are reduced, if not avoided, by creating relative dimensional variations between mold 28 and wafer 30. Specifically, the relative dimensions of mold 28 and wafer 30 are established so that at least one of regions a-1 defines an area that is slightly less than an area of the original pattern on mold 28. Thereafter, the final compensation for magnification/run-out errors is achieved by subjecting template 26, shown in FIG. 17, to mechanical compression forces using actuator sub-assembly 190, which are in turn transferred to mold 28 shown by arrows $F_1$ and $F_2$, $F_3$, $F_4$-$F_8$, shown in FIG. 23. In this manner, the area of the original pattern is made coextensive with the area of the region a-1 in superimposition therewith. To ensure that magnification correction is achieved primarily through reduction of dimensions of mold 28, patterns defined by mold 28 may be generated to be slightly larger than nominal, e.g., slightly larger than desired. In this manner, it could be said that the original pattern defined by mold 28 has a fixed magnification associated therewith, compared to the nominal dimensions of the pattern desired to be recorded in one of regions a-1. Actuator sub-assembly 190 is then employed to compress template 26 to provide the original pattern with a zero magnification. It is possible, however, to create thermal changes to vary the dimension of wafer 30 so that one of regions a-1 has dimensions that are slightly less than the dimensions of mold 28.

Referring again to FIG. 6, when compressing template 26 with actuator sub-assembly 190, relative movement between template 26 and support regions 170 and 172 occurs along the X and Y axes. As a result, in one embodiment support regions 170 and 172 have surface regions 300 and 302, respectively, formed thereon from a combination of materials adapted to conform to a profile of said template 26 and resistant to bulk motion of template 26 along the X and Y axes, e.g., Buna-N, Viton, Silicone, TEFLON®, FEP, Fluorosilicone, Urethane, Kalrez, Simriz, Buna-n, mirror polished anodized Al, Ni plating, or SiC surface, or polished TEFLON® coating, a regular O-ring, TEFLON® tube, TEFLON® coating or any durable material that can be used to seal a vacuum in cleanroom environment. In this manner, surface regions 300 and 302 resist relative movement of template 26 with respect to chuck body 42 in the X and Y directions.

Figure 24:
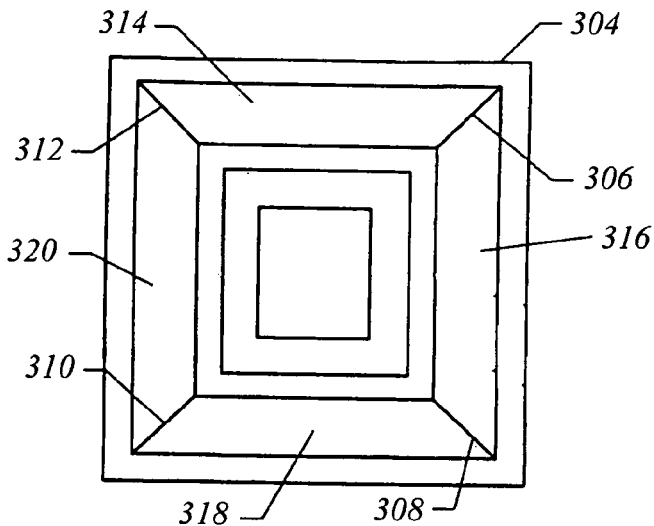
FIG. 24 is a bottom-up plan view of the chuck body, shown in FIG. 16, in accordance with an alternate embodiment.

Referring to both FIGS. 2 and 24, providing a chuck body 304 with walls/baffles 306, 308, 310 and 312 facilitates providing sub-regions 314, 316, 318 and 320 with differing pressure levels, concurrently. As a result, the amount of force exerted on template 26 when being pulled-apart from imprinting layer 34 may vary across the surface of template 26. This allows cantilevering, or peeling-off of template 26 from imprinting layer 34 that reduces distortions or defects from being formed in imprinting layer 34 during separation of mold 28 therefrom. For example, sub-region 316 may have a pressure established therein that is greater than the pressure associated with the remaining sub-regions 314, 318 and 320. As a result, when increasing "distance d," the pulling force to which the portion of template 26 in superimposition with sub-regions 314, 318 and 320 is subjected is greater than the pulling force to which the portion of template 26 in superimposition with sub-region 316 is subjected. Thus, the rate that "d" increases for the portion of template 26 in superimposition with sub-regions 314, 318 and 320 is accelerated compared to the rate at which "d" increases for the portion of template 26 in superimposition with sub-region 316, providing the aforementioned cantilevering effect.

Figure 25:
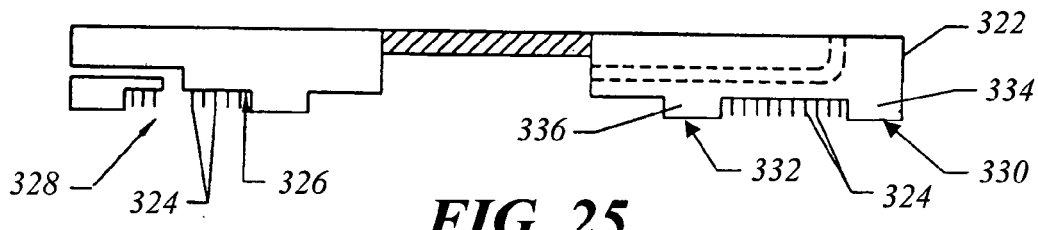
FIG. 25 is a cross-sectional view of a chuck body, shown in FIG. 17, in accordance with a second alternate embodiment.

In yet another embodiment, shown in FIG. 25, chuck body 322 may include a plurality of pins 324 projecting from a nadir surface 326 of out recess 328. Pins 324 provide mechanical support for the template (not shown) retained on chuck body 322 via vacuum and resting against surfaces 330 and 332 of support regions 334 and 336, respectively. Surface regions 330 and 332 provide a fluid-tight seal with the template (not shown). To that end, surfaces 330 and 332 are polished to be optically flat and pins 324 extend from recess 328 terminating in a common plane with surface regions 330 and 332. Mechanical support of the template (not shown) in the Z direction is provided by support regions 334 and 336 and pins 324, with pins 324 typically being rigid posts having a circular or square cross-section. Pins 324 are arranged in a pattern so that the mold (not shown) on template (not shown) is substantially flat when a nominal vacuum pressure is applied.

Figure 26:
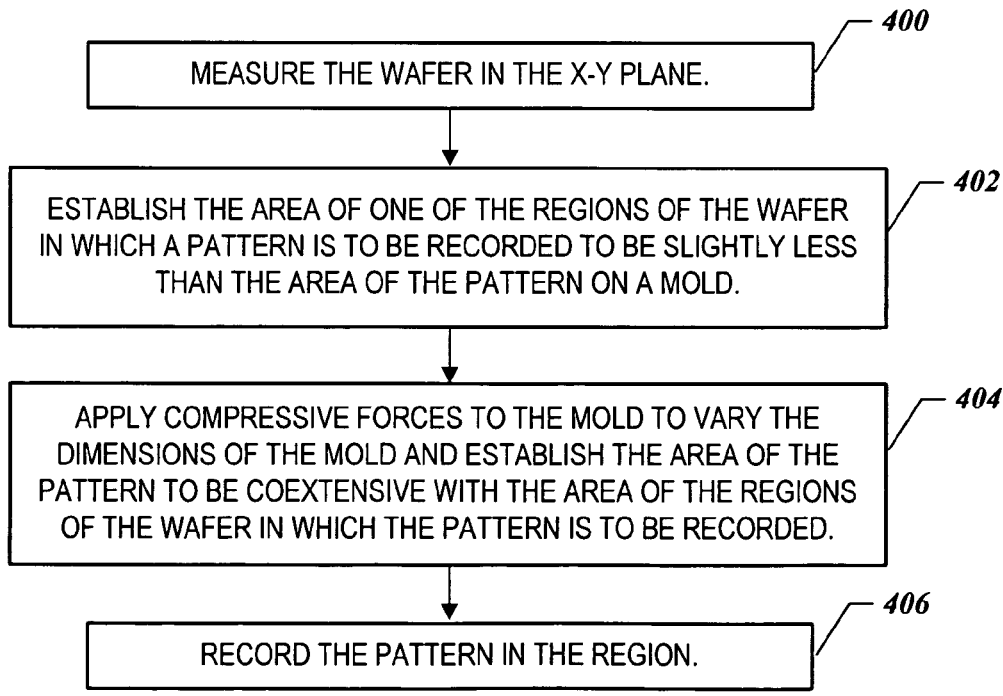
FIG. 26 is a flow diagram showing a method of reducing distortions in patterns formed using imprint lithography techniques in accordance with the present invention.

Referring to FIGS. 22, 23 and 26, in operation, an accurate measurement of wafer 30 in an X-Y plane is undertaken at step 400. This may be achieved by sensing gross alignment fiducials 338 present on wafer 30 using machine vision devices (not shown) and known signal processing techniques. At step 402, the area of one of regions a-1 is established to be slightly less than an area of the original pattern on mold 28. This may be achieved by fabricating mold 28 to have a pattern thereon that is slightly larger than the area of one of regions a-1, and/or expanding mold 28 by varying the temperature thereof as for example, having mold 28 and wafer 30 in a temperature controlled environment (not shown) and varying the temperature of said environment causing dimensional changes that occur due to, inter alia, the differences in coefficients of thermal expansion of the materials from which mold 28 and wafer 30 are fabricated. The inherent assumption when dealing with thermal solutions is that excellent temperature control of the order of +0.01 Celsius of wafer 30 is possible, which may lead to +0.03 ppm distortion that is considered insignificant. Alternatively, or in conjunction therewith, the temperature of wafer 30 may be varied, i.e., raised or lowered, so that the area of one of regions a-1 is slightly less than an area of the original pattern on mold 28. The temperature variations may be achieved using a temperature controlled chuck or pedestal (not shown) against which wafer 30 rests. Alternatively, temperature variation of both wafer 30 and mold 28 may be achieved by placing the same in a temperature controlled chamber (not shown). This may be particularly beneficial were wafer 30 and mold 28 fabricated from materials having differing coefficients of thermal expansion.

The area of each of regions a-1 can be determined by measurement of a change in distance between two collinear gross alignment fiducials 338.

Specifically, a change in the distance between two gross alignment fiducials 338 collinear along one of the X or Y axes is determined. Thereafter, this change in distance is divided by a number of adjacent regions a-1 on the wafer 30 along the X-axis. This provides the dimensional change of the areas of regions a-1 attributable to dimensional changes in wafer 30 along the X-axis. If necessary the same measurement may be made to determine the change in area of regions a-1 due to dimensional changes of wafer 30 along the Y-axis. However, it may also be assumed that the dimensional changes in wafer 30 may be uniform in the two orthogonal axes, X and Y.

At step 404, compressive forces, $F_{1-8}$, are applied to mold 28 to establish the area of the original pattern to be coextensive with the area of one of the regions a-1 in superimposition with the pattern and proper alignment between the pattern on mold 28 and one of the regions a-1. This may be achieved in real-time employing machine vision devices (not shown) and known signal processing techniques, to determine when two or more of alignment marks 298 are aligned with two or more of fiducial marks 296. At step 406, after proper alignment is achieved and magnification/run-out errors are reduced, if not vitiated, the original pattern is recorded in the region a-1 that is in superimposition with mold 28, forming the recorded pattern. It is not necessary that compression forces $F_{1-8}$ have the same magnitude, as the dimensional variations in either wafer 30 or mold 28 may not be uniform in all directions. Further, the magnification/run-out errors may not be identical in both X-Y directions. As a result, compression forces, $F_{1-8}$ may differ to compensate for these anomalies. Specifically, as mentioned above, each lever sub-assembly 196 of actuator sub-assembly 190 may operate independently. This affords application of differing force combinations $F_{1-8}$ to mold 28 to compensate for magnification distortion, as well as distortions that may be present in the pattern on mold, e.g., orthogonality distortions, such as skew distortions and keystone distortions. Furthermore, to ensure greater reduction in magnification/run-out errors, the dimensional variation in mold 28 may be undertaken after mold 28 contacts an imprinting layer (not shown) in FIG. 4. However, this is not necessary.

Referring again to FIGS. 6, 22 and 23, the alignment of mold 28 with regions a-1 in superimposition therewith may occur with mold 28 being spaced-apart from an imprinting layer (not shown). Were it found that the magnification/run-out errors were constant over the entire wafer 30, then the magnitude of forces $F_{1-8}$ could be maintained for each region a-1 in which the original pattern is recorded. However, were it determined that the magnification/run-out errors differed for one or more regions a-1, steps 402 and 404, shown in FIG. 26, would then be undertaken for each region a-1 in which the original pattern is recorded. It should be noted that there are limits to the relative dimensional changes that may occur between wafer 30 and mold 28. For example, the area of the regions a-1 should be of appropriate dimensions to enable pattern on mold 28 to define an area coextensive therewith when mold 28 is subject to compression forces $F_{1-8}$, without compromising the structural integrity of mold 28.

Figure 27:
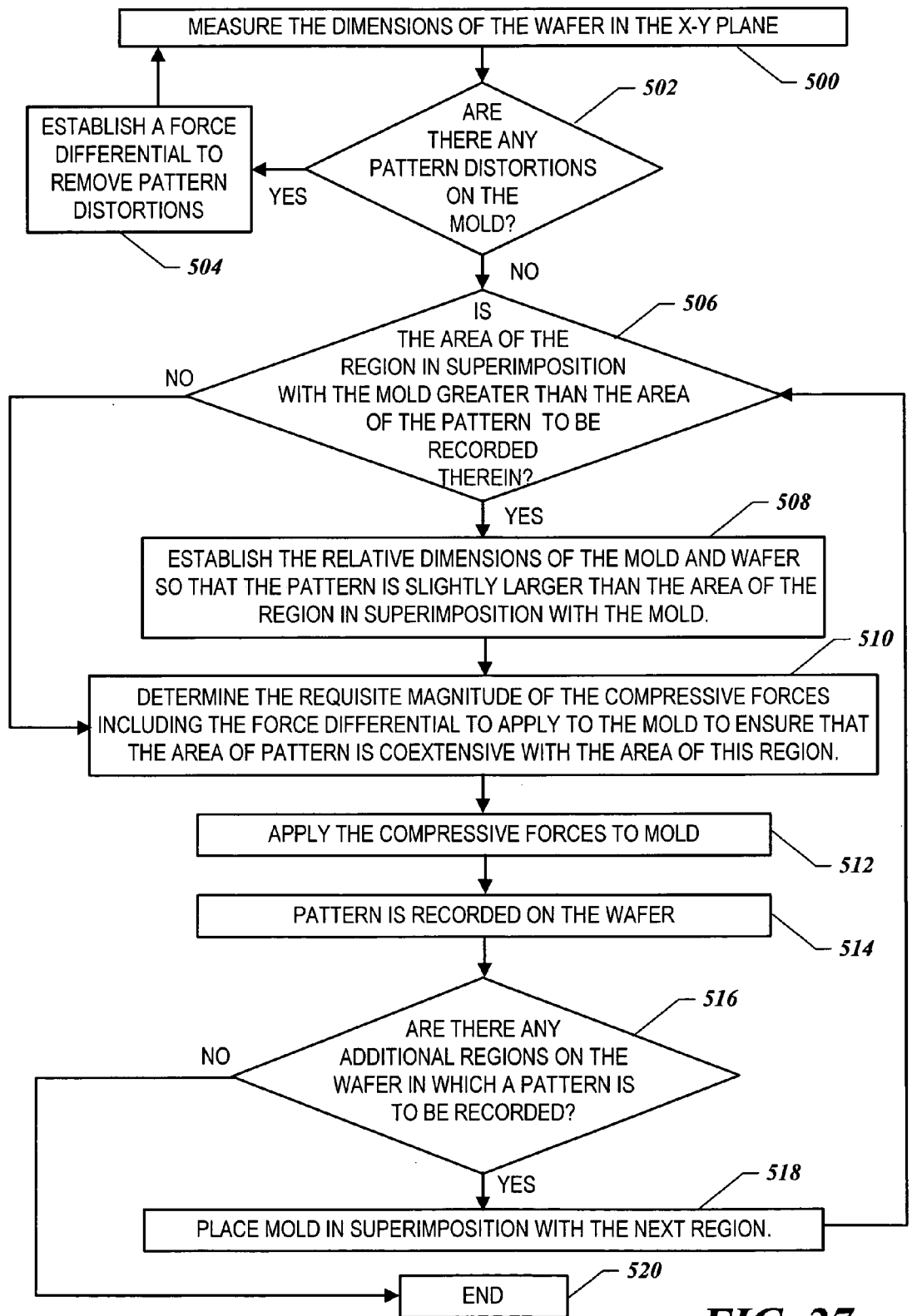
FIG. 27 is a flow diagram showing a method of reducing distortions in patterns formed using imprint lithography techniques in accordance with an alternate embodiment of the present invention.

Referring to FIGS. 22, 23 and 27, in accordance with another embodiment of the present invention, accurate measurement of wafer 30 in an X-Y plane is undertaken at step 500. At step 502, it is determined whether the original pattern on mold 28 has any distortions, e.g., skew distortions, keystone distortions and the like. If there are original pattern distortions, a force differential is established to create the requisite differences in magnitude among forces $F_{1-8}$ to remove the original pattern distortions, defining a force differential, at step 504. In this manner, skew distortions, keystone distortions and the like may be attenuated if not abrogated entirely to provide mold 28 with the original pattern desired. If there are no distortions in the original pattern, it is determined whether the area of one of regions a-1 in superimposition with mold 28 is larger than the area of the pattern on mold 28, at step 506. If this is the case, the process proceeds to step 508, otherwise the process proceeds to step 510. At step 510, mold 28 is placed in contact with the region a-1 in superimposition therewith, and the requisite magnitude of compressive forces $F_{1-8}$ is determined to apply to mold 28 to ensure that the area of pattern is coextensive with the area of this region a-1, with the compressive forces including the force differential. At step 512, compressive forces $F_{1-8}$ are applied to mold 28 and the pattern is recorded in wafer 30. At step 514, the pattern is recorded on wafer 30. Thereafter, mold 28 is spaced-apart from the region a-1 in superimposition with mold 28 and the process proceeds to step 516 where it is determined whether there remain any regions a-1 on wafer 30 in which to record a pattern. If there are, the process proceeds to step 518 wherein mold 28 is placed in superimposition with the next region and the process proceeds to step 506. Otherwise, the process ends at step 520.

Were it determined at step 506 that the region a-1 in superimposition with mold 28 had an area greater than the area of the pattern, then the process proceeds to step 508 wherein the temperature of mold 28 and/or wafer 30 is varied to cause expansion of the same. In the present embodiment, mold 28 is heated at step 508 so that the pattern is slightly larger than the area of region a-1 in superimposition therewith. Then the process continues at step 512.

The embodiments of the present invention described above are exemplary. Many changes and modifications may be made to the disclosure recited above, while remaining within the scope of the invention. For example, by pressurizing all chambers formed by the chuck body-substrate combination with positive fluid pressure, the substrate may be quickly released from the chuck body. Further, many of the embodiments discussed above may be implemented in existing imprint lithography processes that do not employ formation of an imprinting layer by deposition of droplets of polymerizable material. Therefore, the scope of the invention should not be limited by the above description, but instead should be determined with reference to the appended claims along with their full scope of equivalents.

What is claimed is:

1. A system operable to vary dimensions of a substrate, said system comprising:
   a frame;
   a chuck body, coupled to said frame;
   a linkage, coupled to a first side of said frame;
   an actuation system, coupled to a second side of said frame, disposed opposite to said first side;
   a lever arm, extending between said linkage and said actuation system, having first and second opposed termini;
   a first body having a first end; and
   a second body, coupled to said linkage, having a contact surface spaced-apart from said first end a distance, wherein said linkage translates angular motion of said lever arm about an axis into movement of said body in a direction to vary said distance, while allowing angular movement between said body and said lever arm, with said actuation system imparting-said angular movement.

2. The system as recited in claim 1 wherein said linkage further includes a linkage system coupled between said lever arm and said second body to facilitate angular movement of said lever arm with respect to said second body about an additional axis extending parallel to said axis.

3. The system as recited in claim 1 wherein said linkage further includes a linkage system coupled between said lever arm and said second body to facilitate angular movement of said lever arm with respect to said second body about an additional axis extending orthogonally to said axis.

4. The system as recited in claim 1 wherein said linkage further includes a linkage system coupled between said lever arm and said second body to facilitate angular movement of said lever arm with respect to said second body about two additional axes one of which extends orthogonally to said axis, with the remaining axis of said two additional axes extending parallel to said axis.

5. The system as recited in claim 1 wherein said contact surface is formed from a compliant material.

6. The system as recited in claim 1 further including an amplifier coupled to said second body, with said actuation system imparting a first force upon an additional contact surface of said second body, with said amplifier imparting a second force upon said contact surface in response to said first force with a magnitude of said second force being greater than a magnitude of said first force.

7. The system as recited in claim 1 further including an amplifier coupled to said second body, with said actuation system imparting a first force upon an additional contact surface of said second body, with said amplifier imparting a second force upon said first terminus, with a magnitude of said second force being a multiple of a magnitude of said first force.

8. The system as recited in claim 1 further including an amplifier coupled to said second body, with said actuation system imparting a first force upon an additional contact surface of said second body, with said amplifier imparting a second force upon said first terminus in response to said first force, with said amplifier including a pivot disposed from said first end a first length and disposed from said second end a second length with said magnitude of said second force being a function of a ratio of said first length and said second length.

9. The system as recited in claim 1 wherein said actuation system comprises a pneumatic actuator.

10. A system operable to vary dimensions of a substrate, said system comprising:

a plurality of bodies disposed about a perimeter defining an area, with a subset of said plurality of bodies being coupled to a lever arm through a linkage to translate angular motion of said lever arm about an axis to vary said area by imparting motion onto one of said plurality of bodies along a direction extending transversely to said axis, with said direction being substantially constant over a range of motion of said lever arm about said axis; and an actuation system to impart said angular movement.

11. The system as recited in claim 10 wherein said linkage further includes a linkage system coupled between one of said plurality of bodies and said lever arm to facilitate angular movement of said body with respect to said lever arm about an additional axis extending parallel to said axis.

12. The system as recited in claim 10 wherein said linkage further includes a linkage system coupled between one of said plurality of bodies and said lever arm to facilitate angular movement of said body with respect to said lever arm about an additional axis extending orthogonally to said axis.

13. The system as recited in claim 10 wherein said linkage further includes a linkage system coupled between one of said plurality of bodies and said lever arm to facilitate angular movement of said body with respect to said lever arm about two additional axes one of which extends orthogonally to said axis, with the remaining axis of said two additional axes extending parallel to said axis.

14. The system as recited in claim 10 wherein one end of said body is formed from a compliant material.

15. The system as recited in claim 10 further including an amplifier coupled to said lever arm, with said actuation system imparting a first force upon a said lever arm, with said amplifier imparting a second force upon said one of the bodies of said subset in response to said first force, with a magnitude of said second force being greater than a magnitude of said first force.

16. The system as recited in claim 10 further including an amplifier coupled to said second body, with said actuation system imparting a first force upon said lever arm, with said amplifier imparting a second force upon said body, with a magnitude of said second force being a multiple of a magnitude of said first force.

17. The system as recited in claim 10 further including an amplifier coupled to said second body, with said actuation system imparting a first force upon said lever arm, with said amplifier imparting a second force upon said body in response to said first force, with said amplifier including a pivot positioned between opposed ends of said lever arm, with said pivot being positioned, with respect to one of said opposed ends, a first length and positioned from the remaining of said opposed ends, a second length with a magnitude of said second force being a function of a ratio of said first length and said second length.

18. The system as recited in claim 10 wherein said actuation system comprises a pneumatic actuator.

* * * * *